(12) United States Patent
Masuda et al.

(10) Patent No.: US 10,197,915 B2
(45) Date of Patent: Feb. 5, 2019

(54) RESIN AND PHOTOSENSITIVE RESIN COMPOSITION

(71) Applicant: TORAY INDUSTRIES, INC., Tokyo (JP)

(72) Inventors: Yuki Masuda, Otsu (JP); Yohei Kiuchi, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/529,408

(22) PCT Filed: Nov. 19, 2015

(86) PCT No.: PCT/JP2015/082523
§ 371 (c)(1),
(2) Date: May 24, 2017

(87) PCT Pub. No.: WO2016/084694
PCT Pub. Date: Jun. 2, 2016

(65) Prior Publication Data
US 2017/0327644 A1     Nov. 16, 2017

(30) Foreign Application Priority Data
Nov. 27, 2014   (JP) ................. 2014-239766

(51) Int. Cl.
*G03F 7/004*     (2006.01)
*G03F 7/039*     (2006.01)
(Continued)

(52) U.S. Cl.
CPC ............. *G03F 7/039* (2013.01); *C08G 69/42* (2013.01); *C08G 73/10* (2013.01);
(Continued)

(58) Field of Classification Search
CPC .......... G03F 7/004; G03F 7/022; G03F 7/039; G03F 7/32; G03F 7/16; G03F 7/20;
(Continued)

(56) References Cited

U.S. PATENT DOCUMENTS 6,096,850 A    8/2000   Chiang et al.
2011/0118375 A1*   5/2011   Sugiyama ............. G03F 7/0226
                                                                                             522/48

FOREIGN PATENT DOCUMENTS

JP     2000-34346 A     2/2000
JP     2002-162743 A    6/2002
(Continued)

OTHER PUBLICATIONS

Machine translation of JP 2007-016214 (no date).*
(Continued)

*Primary Examiner* — Amanda C. Walke
(74) *Attorney, Agent, or Firm* — Birch, Stewart, Kolasch & Birch LLP

(57) ABSTRACT

Provided is a resin capable of producing a photosensitive resin composition having high sensitivity and heat resistance. Disclosed is a resin having a structure represented by general formula (1) or (2) as a main component, wherein $R^2$ has an organic group represented by general formula (3) and an organic group represented by general formula (4).

7 Claims, 2 Drawing Sheets

(51) Int. Cl.
    *G03F 7/20*         (2006.01)
    *G03F 7/075*      (2006.01)
    *C08G 69/42*      (2006.01)
    *C08G 73/10*      (2006.01)
    *H01L 21/027*     (2006.01)
    *C09D 179/08*     (2006.01)
    *G03F 7/022*      (2006.01)
    *G03F 7/32*       (2006.01)
    *H01L 21/78*      (2006.01)
    *H01L 23/00*      (2006.01)
    *G03F 7/023*      (2006.01)
    *G03F 7/16*       (2006.01)
    *G03F 7/40*       (2006.01)

(52) U.S. Cl.
    CPC ....... *C08G 73/1064* (2013.01); *C09D 179/08* (2013.01); *G03F 7/022* (2013.01); *G03F 7/0233* (2013.01); *G03F 7/075* (2013.01); *G03F 7/20* (2013.01); *G03F 7/322* (2013.01); *H01L 21/027* (2013.01); *H01L 21/0274* (2013.01); *H01L 21/78* (2013.01); *H01L 24/02* (2013.01); *H01L 24/13* (2013.01); *H01L 24/94* (2013.01); *G03F 7/0755* (2013.01); *G03F 7/162* (2013.01); *G03F 7/168* (2013.01); *G03F 7/2004* (2013.01); *G03F 7/40* (2013.01); *H01L 2224/02311* (2013.01); *H01L 2224/13024* (2013.01)

(58) Field of Classification Search
    CPC ....... G03F 7/40; G03F 7/075; H01L 21/0274; C08G 73/10
    USPC ...................................................... 430/270.1
    See application file for complete search history.

(56) References Cited

FOREIGN PATENT DOCUMENTS

| | | |
|---|---|---|
| JP | 2003-5369 A | 1/2003 |
| JP | 2007-16214 A | 1/2007 |
| JP | 2008-7744 A | 1/2008 |
| JP | 2009-198957 A | 9/2009 |
| JP | 2012-68413 A | 4/2012 |
| WO | WO 2010/004849 A1 | 1/2010 |

OTHER PUBLICATIONS

Machine translation of JP 2008-007744 (no date).*
Machine translation of JP 2012-068413 (no date).*
International Search Report for PCT/JP2015/082523 (PCT/ISA/210) dated Feb. 16, 2016.
Written Opinion of the International Searching Authority for PCT/JP2015/082523 (PCT/ISA/237) dated Feb. 16, 2016.

\* cited by examiner

[Fig. 1]
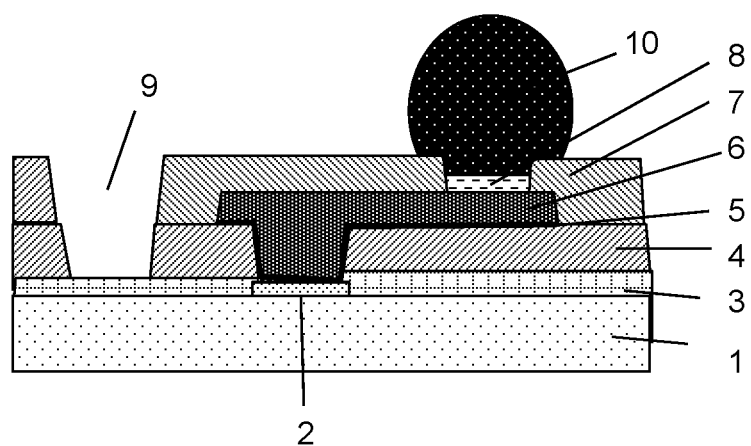

[Fig. 2]
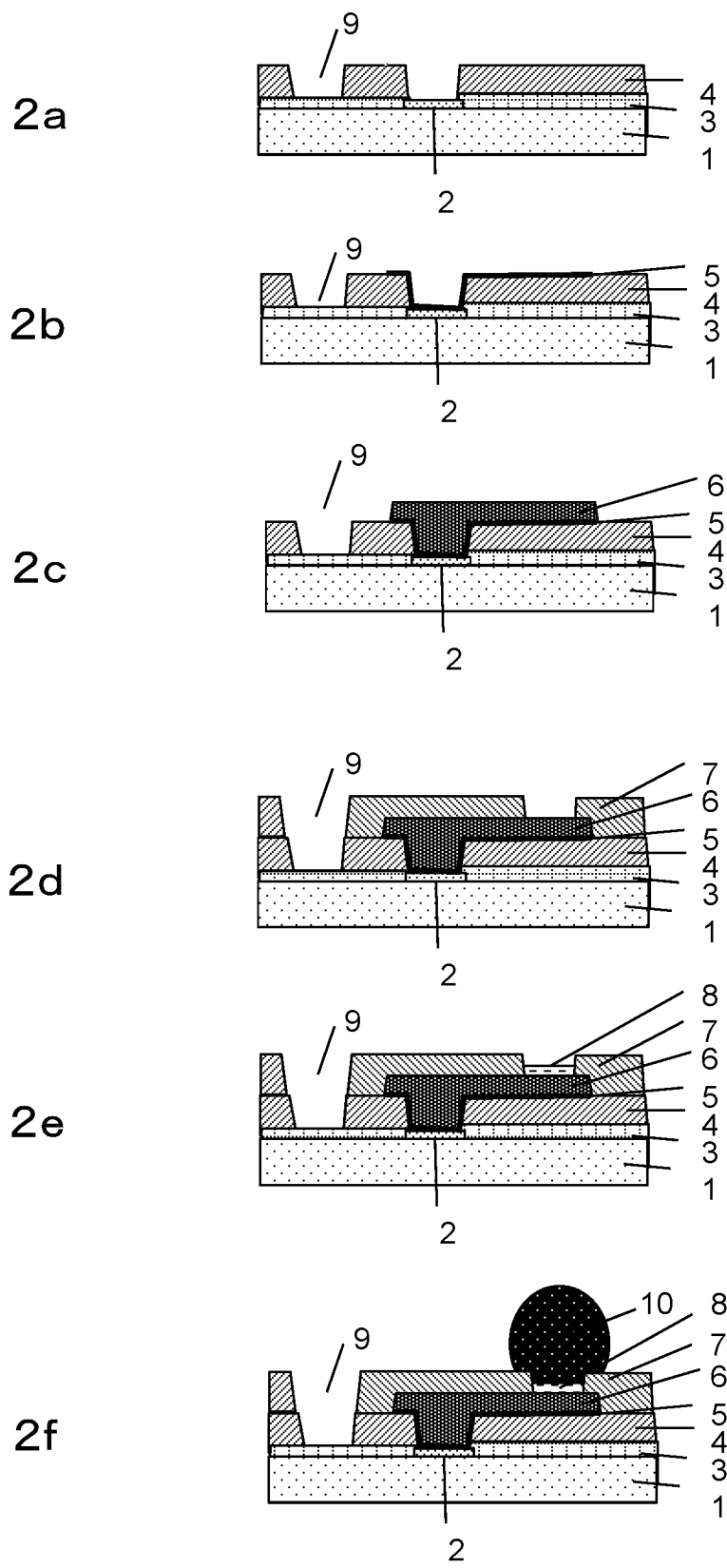

RESIN AND PHOTOSENSITIVE RESIN COMPOSITION

TECHNICAL FIELD

The present invention relates to a resin having a specific structure. More specifically, it relates to a resin suitable for a surface protective film of a semiconductor device, an interlayer dielectric film, an insulating layer of an organic electroluminescent element, etc., and also to a photosensitive resin composition using the same.

BACKGROUND ART

Polyimide and polybenzoxazole resins have excellent heat resistance, electrical insulation properties, and mechanical characteristics. Accordingly, they have been widely used for surface protective films of semiconductor devices, interlayer dielectric films, insulating layers of organic electroluminescent elements, etc.

In the case where a polyimide or polybenzoxazole resin is used as a surface protective film or an interlayer dielectric film, as a method for forming through holes, etc., etching using a positive photoresist can be mentioned. However, this method has a problem in that the process includes applying and stripping a photoresist and thus is complicated. Thus, for the purpose of rationalizing the operation process, heat-resistant materials having photosensitivity have been examined.

For example, as positive-working photosensitive heat-resistant compositions that can be developed with an aqueous alkali solution, a composition containing a polyamic acid ester having a phenolic hydroxyl group and an o-quinonediazide compound (Patent Document 1), a composition containing a solvent-soluble, closed-ring polyimide and a naphthoquinonediazide compound (Patent Document 2), and a composition containing a polybenzoxazole precursor and a naphthoquinonediazide compound (Patent Document 3) have been reported.

However, in recent years, with the increase in wafer size, device downscaling, and the increase in package density, speed, and capacity, there have been increasing demands for interlayer dielectric films having high sensitivity applicable to multilayer interconnection.

In response to these requirements, in order to improve the solubility in a developing solution and the transparency, it has been examined to increase the sensitivity of a polyamic acid resin by using an alicyclic structure (Patent Documents 4 and 5) or a phenolic-hydroxyl-group-containing diamine having an electron-withdrawing hexafluoropropyl group or sulfonyl group (Patent Documents 6 and 7).

PRIOR ART DOCUMENTS

Patent Documents

Patent Document 1: Japanese Patent Laid-open Publication No. 4-204945
Patent Document 2: Japanese Patent Laid-open Publication No. 2007-183388
Patent Document 3: Japanese Patent Laid-open Publication No. 56-027140
Patent Document 4: WO 2000/73853
Patent Document 5: Japanese Patent Laid-open Publication No. 2010-196041
Patent Document 6: Japanese Patent Laid-open Publication No. 2005-352004
Patent Document 7: Japanese Patent Laid-open Publication No. 2007-94011

SUMMARY OF THE INVENTION

Problems to be Solved by the Invention

However, with respect to a polyamic acid ester or a polyimide material, which has a large number of phenolic hydroxyl groups, there has been a problem in that phenolic hydroxyl groups remain after curing, whereby the heat resistance is deteriorated. In addition, with respect to a polybenzoxazole precursor, wherein no phenolic hydroxyl groups remain after subjecting the coating film to thermal dehydrative ring-closure and curing, usually, a high-temperature heating treatment at 300° C. or higher is required for thermal dehydrative ring-closure. Accordingly, there has been a problem in that in the case of a heating treatment at a low temperature, the heat resistance is even poorer.

Thus, in light of the problems of prior art described above, an object of the present invention is to provide a resin having high sensitivity and heat resistance when applied to a photosensitive resin composition.

Solutions to the Problems

As a result of extensive research to solve the above problems, the present invention has been accomplished.

That is, the present invention is directed to a resin having a structure represented by general formula (1) or (2) as a main component.

In the formula, $R^1$ is a $C_{2-30}$ divalent to octavalent organic group. $R^2$ has an organic group having no hydroxyl group and having a sulfonyl group. $R^3$ may be the same or different and represents a hydrogen atom or a $C_{1-20}$ organic group. n is within a range of 10 to 100,000, m represents an integer of 0 to 2, and p represents an integer of 0 to 4.

[Chemical Formula 1]

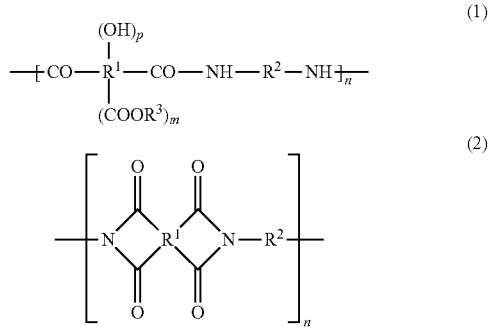

In addition, the present invention is directed to a resin having a structure represented by general formula (1) or (2) as a main component, wherein $R^2$ has an organic group represented by general formula (3) and an organic group represented by general formula (4).

In the formula, $R^1$ is a $C_{2-30}$ divalent to octavalent organic group, and $R^2$ has an organic group represented by general formula (3) and an organic group represented by general formula (4). $R^3$ and $R^5$ may be the same or different and represent a hydrogen atom or a $C_{1-20}$ organic group. $R^4$ represents a $C_{2-20}$ trivalent to octavalent organic group (except for a structure having a sulfonyl group), and $R^6$ represents a $C_{2-30}$ divalent to octavalent organic group having no hydroxyl group and having a sulfonyl group and an aromatic ring. n is within a range of 10 to 100,000, m and l each represent an integer of 0 to 2, p represents an integer of 0 to 4, and q represents an integer of 1 to 4, with the proviso that p+q>1.

[Chemical Formula 2]

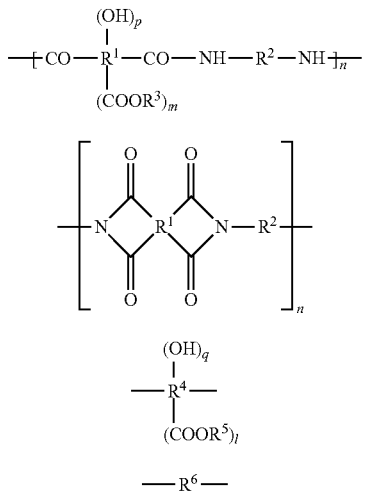

(1)

(2)

(3)

(4)

The present invention is also directed to a photosensitive resin composition containing a resin having a structure represented by general formula (1) or (2) as a main component (a), a photoacid generator (b), a thermal crosslinker (c), and a solvent (d) and having positive photosensitivity.

The present invention is also directed to a method for producing a patterned cured film using the photosensitive resin composition of the present invention, the method for producing a patterned cured film including: a step of applying the photosensitive resin composition described above onto a supporting substrate, followed by drying, thereby giving a photosensitive resin film; a step of exposing the obtained photosensitive resin film; a step of developing the exposed photosensitive resin film using an aqueous alkali solution, thereby giving a patterned resin film; and a step of heat-treating the patterned resin film obtained in the above step. The present invention is also directed to an interlayer dielectric film obtainable by the method for producing a patterned cured film of the present invention. The present invention is also directed to a surface protective film obtainable by the method for producing a patterned cured film of the present invention. The present invention is also directed to an electronic component including the interlayer dielectric film or surface protective film of the present invention.

Effects of the Invention

According to the present invention, it is possible to obtain a resin having high sensitivity/heat resistance when applied to a photosensitive resin composition.

BRIEF DESCRIPTION OF THE DRAWINGS

FIG. 1 is a cross-sectional view of a pad portion of a semiconductor device showing an example of the present invention.

FIG. 2 is a cross-sectional view of a production process of a semiconductor device showing an example of the present invention.

EMBODIMENTS OF THE INVENTION

The resin having a structure represented by general formula (1) as a main component (a) of the present invention is a resin that can be converted into a polymer having an imide ring, an oxazole ring, or another cyclic structure by heating or with a suitable catalyst. Preferred examples thereof include polyamic acid and polyamic acid esters, which are polyimide precursors, and polyhydroxyamide-polyamide copolymers, which are polybenzoxazole precursors. In addition, the resin having a structure represented by general formula (2) as a main component (a) of the present invention is a polyimide ring-closed by heating, a polyimide precursor composed of a resin partially ring-closed and imidized by heating, or a copolymer of a polyimide and a polybenzoxazole precursor or a polyamide. "Main component" as used herein means that the proportion of the structure represented by general formula (1) or (2) is 50 mol % or more of the entire resin.

In the formula, $R^1$ is a $C_{2-30}$ divalent to octavalent organic group, and $R^2$ has an organic group having no hydroxyl group and having a sulfonyl group.

In addition, the present invention is directed to a resin having a structure represented by general formula (1) or (2) as a main component, wherein $R^2$ has an organic group represented by general formula (3) and an organic group represented by general formula (4). $R^1$ is a $C_{2-30}$ divalent to octavalent organic group, and $R^3$ and $R^5$ may be the same or different and represent a hydrogen atom or a $C_{1-20}$ organic group. $R^4$ represents a $C_{2-20}$ trivalent to octavalent organic group (except for a structure having a sulfonyl group), and $R^6$ represents a $C_{2-30}$ divalent to octavalent organic group having no hydroxyl group and having a sulfonyl group and an aromatic ring. n is within a range of 10 to 100,000, m and l each represent an integer of 0 to 2, p represents an integer of 0 to 4, and q represents an integer of 1 to 4, with the proviso that p+q>1.

[Chemical Formula 3]

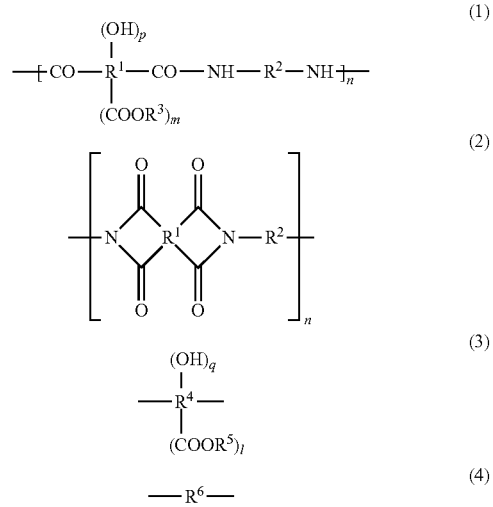

(1)

(2)

(3)

(4)

In general formulae (1) and (2), $R^2$ has an organic group represented by general formula (3) and an organic group represented by general formula (4), and shows the diamine structure component.

The organic group represented by general formula (3) has a hydroxyl group and has a phenolic hydroxyl group. The presence of a phenolic hydroxyl group provides moderate solubility in an alkali developing solution and contributes to the interaction with a photosensitizer, making it possible to obtain a resin film capable of improving the residual film rate and enhancing the sensitivity; therefore, this is preferable.

However, a phenolic hydroxyl group may deteriorate the heat resistance. When $R^2$ has both an organic group represented by general formula (3) and an organic group represented by general formula (4), as the entire resin, the amount of phenolic hydroxyl groups can be reduced. Accordingly, the polyimide precursor or polyimide, which is a resin having a structure represented by general formula (1) or general formula (2) as a main component, has a phenolic hydroxyl group in an organic group represented by general formula (3), and a sulfonyl group in an organic group represented by general formula (4). As a result, while achieving the enhancement of the sensitivity of a resin composition, the heat resistance of the cured film obtained from the resin composition can also be improved. With respect to a polybenzoxazole precursor, wherein no phenolic hydroxyl groups remain after curing, usually, a high-temperature heating treatment of 300° C. or higher is required for thermal dehydrative ring-closure. Accordingly, when only a heating treatment at a low temperature of 250° C. is performed, the structure partially remains ring-opened, and the heat resistance of such a cured film is insufficient. Thus, copolymerization with a polyamide having no phenolic hydroxyl group is performed. As a result, the heat resistance can be improved, offering the same effect as that of a high-temperature heating treatment.

The above organic group represented by general formula (4) does not have a phenolic hydroxyl group but has a sulfonyl group and an aromatic ring. In the case where the organic group represented by general formula (4) has a hydrophobic organic group, such as a trifluoromethyl group, or a free radical having low electron withdrawing characteristics, the solubility at the time of development is deteriorated, resulting in the deterioration of sensitivity and the formation of pattern residues. A sulfonyl group has high electron withdrawing characteristics and hydrophilicity. Accordingly, in the case where a phenolic hydroxyl group is present in the adjoining area, the acidity thereof increases, and the solubility significantly increases, resulting in the problem of film dissolution at the time of development. However, in the case where a free radical of a sulfonyl group is introduced with no phenolic hydroxyl group, as the organic group represented by general formula (4) of the present invention, suitable solubility is obtained. Accordingly, a material having an excellent residual film rate and capable of achieving the enhancement of sensitivity can be provided.

With respect to the organic group having a sulfonyl group represented by general formula (4), it is preferable that $R^6$ has an organic group represented by the following general formula (5).

[Chemical Formula 4]

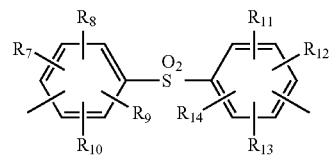

(5)

$R^7$ to $R^{14}$ have no hydroxyl group and each independently represent a hydrogen atom, a halogen atom, or a $C_{1-30}$ monovalent organic group.

In addition, in the resin having a structure represented by general formula (1) or (2) as a main component, it is preferable that $R^2$ is such that the mole ratio between the organic group represented by general formula (3) and the organic group represented by general formula (4) is 9:1 to 5:5, still more preferably 8:2 to 5:5. When the ratio is within this range, both a phenolic hydroxyl group and a sulfonyl group of an organic group represented by general formula (4) can be present. Therefore, while achieving the enhancement of the sensitivity of a resin composition, the heat resistance of the cured film obtained from the resin composition can also be improved.

Specific examples of $R^4(COOR^5)_l(OH)_q$ in general formula (3) include residues of hydroxyl-group-containing diamines, such as bis(amino-hydroxy-phenyl)hexafluoropropane, diaminodihydroxypyrimidine, diaminodihydroxypyridine, hydroxy-diamino-pyrimidine, diaminophenol, dihydroxybenzidine, diaminobenzoic acid, diaminoterephthalic acid bis(amino-hydroxyphenyl)propane, bis(amino-hydroxyphenyl)methylene, bis(amino-hydroxyphenyl)ether, bis(amino-hydroxy)biphenyl, and bis(amino-hydroxyphenyl)fluorene, as well as residues of compounds obtained by partially substituting the hydrogen atoms of these aromatic rings with a $C_{1-10}$ alkyl group, a fluoroalkyl group, a halogen atom, or the like, and also structures represented by any one of general formulae (8) to (10).

[Chemical Formula 5]

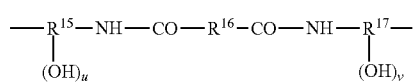

(8)

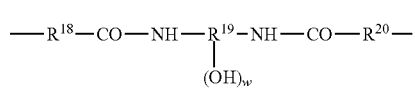

(9)

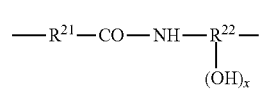

(10)

(In general formula (8), $R^{15}$ and $R^{17}$ may be the same or different and represent a $C_{2-20}$ trivalent to tetravalent organic group, and $R^{16}$ represents a $C_{2-30}$ divalent organic group. u and v each represent 1 or 2. In general formula (9), $R^{18}$ and $R^{20}$ may be the same or different and represent a $C_{2-20}$ divalent organic group, and $R^{19}$ represents a $C_{3-20}$ trivalent to hexavalent organic group. w represents an integer of 1 to 4. In general formula (10), $R^{21}$ represents a $C_{2-20}$ divalent organic group, and $R^{22}$ represents a $C_{3-20}$ trivalent to hexavalent organic group. x represents an integer of 1 to 4.)

In the resin having a structure represented by general formula (1) or (2) as a main component, it is preferable that $R^2$ has two or more kinds of organic groups represented by general formula (3). In particular, in order to obtain a sensitivity-improving effect, it is more preferable that one kind of them has a structure represented by any one of general formulae (8) to (10). When $R^2$ has two or more kinds of organic groups represented by general formula (3), solubility variation occurs between the surface and interior of the coating film. At this time, a hardly soluble layer is formed on the surface of the coating film. Accordingly, the dissolution contrast between the unexposed area and the exposed area is improved, whereby the sensitivity is improved.

In general formula (8), $R^{15}$ and $R^{17}$ each represent a $C_{2-20}$ trivalent to tetravalent organic group. In terms of the heat resistance of the obtained polymer, a group having an aromatic ring is preferable. Specific examples of $-R^{15}(OH)u-$ and $-R^{17}(OH)v-$ include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl) hexafluoropropane group, a bis(hydroxyphenyl) propane group, a bis(hydroxyphenyl)sulfone group, a hydroxydiphenylether group, and a dihydroxydiphenylether group. In addition, it is also possible to use aliphatic groups, such as a hydroxycyclohexyl group and a dihydroxycyclohexyl group. $R^{16}$ represents a $C_{2-30}$ divalent organic group. In terms of the heat resistance of the obtained polymer, a divalent group having an aromatic group is preferable. Examples thereof include a phenyl group, a biphenyl group, a diphenylether group, a diphenylhexafluoropropane group, and a diphenylpropane group. In addition to them, it is also possible to use an aliphatic cyclohexyl group, for example.

In general formula (9), $R^{18}$ and $R^{20}$ each represent a $C_{2-20}$ divalent organic group. In terms of the heat resistance of the obtained polymer, a divalent group having an aromatic group is preferable. Examples thereof include a phenyl group, a biphenyl group, a diphenylether group, a diphenylhexafluoropropane group, a diphenylpropane group, and a diphenylsulfone group. In addition to them, it is also possible to use an aliphatic cyclohexyl group, for example. $R^{19}$ represents a $C_{3-20}$ trivalent to hexavalent organic group. In terms of the heat resistance of the obtained polymer, a group having an aromatic ring is preferable. Specific examples of $-R^{19}(OH)w-$ include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl) hexafluoropropane group, a bis(hydroxyphenyl) propane group, a hydroxydiphenylether group, and a dihydroxydiphenylether group. In addition, it is also possible to use aliphatic groups, such as a hydroxycyclohexyl group and a dihydroxycyclohexyl group.

In general formula (10), $R^{21}$ represents a $C_{2-20}$ divalent organic group. In terms of the heat resistance of the obtained polymer, a divalent group having an aromatic group is preferable. Examples thereof include groups such as a phenyl group, a biphenyl group, a diphenylether group, a diphenylhexafluoropropane group, and a diphenylpropane group. In addition to them, it is also possible to use an aliphatic cyclohexyl group, for example. $R^{22}$ represents a $C_{3-20}$ organic group. In terms of the heat resistance of the obtained polymer, a group having an aromatic ring is preferable. Specific examples of $-R^{22}(OH)x-$ include a hydroxyphenyl group, a dihydroxyphenyl group, a hydroxynaphthyl group, a dihydroxynaphthyl group, a hydroxybiphenyl group, a dihydroxybiphenyl group, a bis(hydroxyphenyl)hexafluoropropane group, a bis(hydroxyphenyl)propane group, a hydroxydiphenylether group, and a dihydroxydiphenylether group. In addition, it is also possible to use aliphatic groups, such as a hydroxycyclohexyl group and a dihydroxycyclohexyl group.

In addition, u and v in general formula (8) each represent 1 or 2, and w in general formula (9) and x in general formula (10) each represent an integer of 1 to 4.

Among structures represented by general formula (8), preferred structures are, but not limited to, the following structures, for example.

[Chemical Formula 6]

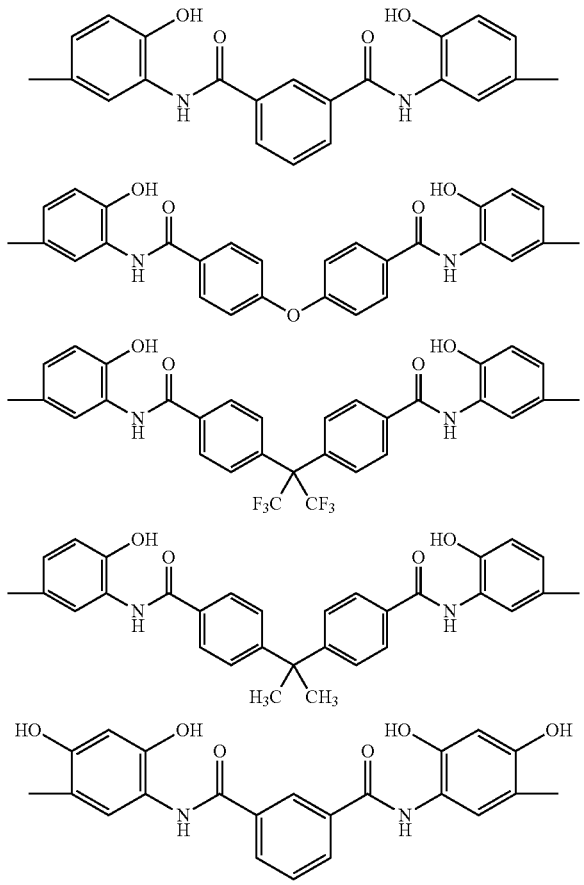

In addition, among structures represented by general formula (9), preferred structures are, but not limited to, the following structures, for example.

[Chemical Formula 7]

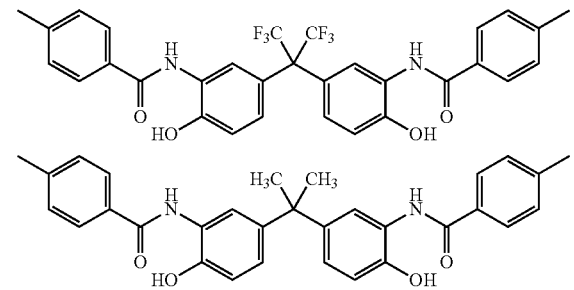

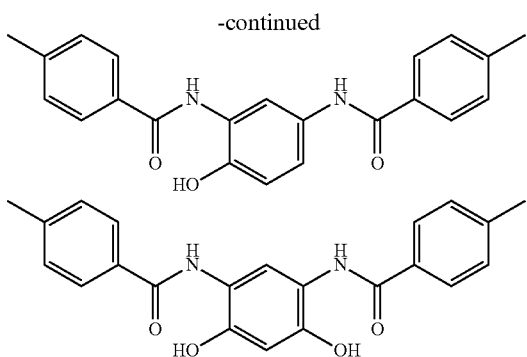

Among structures represented by general formula (10), preferred structures are, but not limited to, the following structures, for example.

[Chemical Formula 8]

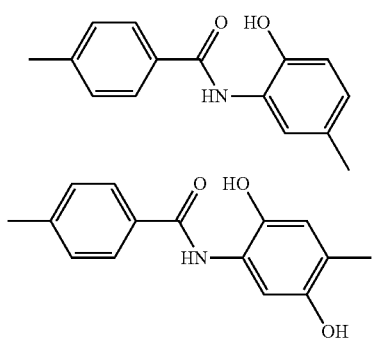

In general formula (1), $R^1$ represents a $C_{2-30}$ divalent to octavalent organic group and shows the acid structure component. Examples of acids wherein $R^1$ is divalent include aromatic dicarboxylic acids such as terephthalic acid, isophthalic acid, diphenyletherdicarboxylic acid, naphthalenedicarboxylic acid, and bis(carboxyphenyl)propane, aromatic dicarboxylic acids such as cyclohexanedicarboxylic acid, and aliphatic dicarboxylic acids such as cyclobutanedicarboxylic acid, cyclohexanedicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethyl methylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, and diglycolic acid. Examples further include tricarboxylic acids such as trimellitic acid and trimesic acid, as well as compounds obtained by partially substituting the hydrogen atoms of these aromatic rings and hydrocarbons with a $C_{1-10}$ alkyl group, a fluoroalkyl group, a halogen atom, or the like, and also structures derived from those having bonds such as —S—, —SO—, —$SO_2$—, —NH—, —$NCH_3$—, —$N(CH_2CH_3)$—, —$N(CH_2CH_2CH_3)$—, —$N(CH(CH_3)_2)$—, —COO—, —CONH—, —OCONH—, and —NHCONH—.

Examples of acids wherein $R^1$ is trivalent include tricarboxylic acids such as trimellitic acid and trimesic acid.

Examples of acids wherein $R^1$ is tetravalent include aromatic tetracarboxylic acids such as pyromellitic acid, benzophenonetetracarboxylic acid, biphenyltetracarboxylic acid, diphenylethertetracarboxylic acid, benzophenonetetracarboxylic acid, 1,2-dimethyl-1,2,3,4-cyclobutanetetracarboxylic acid, 1,2,3,4-tetramethyl-1,2,3,4-cyclobutanetetracarboxylic acid, 1,2,4,5-cyclohexanetetracarboxylic acid, 3,4-dicarboxy-1,2,3,4-tetrahydro-1-naphthalenesuccinic acid, 5-(2,5-dioxotetrahydrofuryl)-3-methyl-3-cyclohexene-1,2-dicarboxylic acid, 2,3,5-tricarboxy-2-cyclopentaneacetic acid, bicyclo[2.2.2]oct-7-ene-2,3,5,6-tetracarboxylic acid, 2,3,4,5-tetrahydrofuran tetracarboxylic acid, 3,5,6-tricarboxy-2-norbornaneacetic acid, 1,3,3a,4,5,9b-hexahydro-5(tetrahydro-2,5-dioxo-3-furanyl)naphth[1,2-c]furan-1,3-dione, 2,2-bis(3,4-dicarboxyphenyl)propane, 2,2-bis(2,3-dicarboxyphenyl)propane, 1,1-bis(2,3-dicarboxyphenyl)ethane, bis(3,4-dicarboxyphenyl)methane, bis(2,3-dicarboxyphenyl)methane, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, bis(3,4-dicarboxyphenyl)ether, and 2,2-bis(3,4-dicarboxyphenyl)hexafluoropropane, as well as compounds obtained by substituting the aromatic rings of these compounds with an alkyl group, a hydroxyl group, or a halogen atom, and also tetracarboxylic acids having an amide group.

In addition, it is also possible to use acids having a hydroxyl group, such as hydroxyphthalic acid and hydroxytrimellitic acid. In addition, these acid components may be used alone, or it is also possible to mix two or more kinds.

In general formula (2), $R^1$ represents a $C_{2-30}$ tetravalent to octavalent organic group and shows the acid structure component. Examples of acids wherein $R^1$ is tetravalent include aromatic tetracarboxylic acids such as pyromellitic acid, benzophenonetetracarboxylic acid, biphenyltetracarboxylic acid, diphenylethertetracarboxylic acid, benzophenonetetracarboxylic acid, 1,2-dimethyl-1,2,3,4-cyclobutanetetracarboxylic acid, 1,2,3,4-tetramethyl-1,2,3,4-cyclobutanetetracarboxylic acid, 1,2,4,5-cyclohexanetetracarboxylic acid, 3,4-dicarboxy-1,2,3,4-tetrahydro-1-naphthalenesuccinic acid, 5-(2,5-dioxotetrahydrofuryl)-3-methyl-3-cyclohexene-1,2-dicarboxylic acid, 2,3,5-tricarboxy-2-cyclopentaneacetic acid, bicyclo[2.2.2]oct-7-ene-2,3,5,6-tetracarboxylic acid, 2,3,4,5-tetrahydrofuran tetracarboxylic acid, 3,5,6-tricarboxy 2-norbornaneacetic acid, 1,3,3a,4,5,9b-hexahydro-5(tetrahydro-2,5-dioxo-3-furanyl)naphth[1,2-c]furan-1,3-dione, 2,2-bis(3,4-dicarboxyphenyl)propane, 2,2-bis(2,3-dicarboxyphenyl)propane, 1,1-bis(2,3-dicarboxyphenyl)ethane, bis(3,4-dicarboxyphenyl)methane, bis(2,3-dicarboxyphenyl)methane, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid, bis(3,4-dicarboxyphenyl)ether, and 2,2-bis(3,4-dicarboxyphenyl)hexafluoropropane, as well as compounds obtained by substituting the aromatic rings of these compounds with an alkyl group, a hydroxyl group, or a halogen atom, and also tetracarboxylic acids having an amide group. In addition, it is also possible to use acids having a hydroxyl group, such as hydroxyphthalic acid and hydroxytrimellitic acid. In addition, these acid components may be used alone, or it is also possible to mix two or more kinds.

$R^3$ and $R^5$ in general formulae (1) and (3) may be the same or different and represent a hydrogen atom or a $C_{1-20}$ organic group. In terms of the solution stability of the obtained photosensitive resin solution, it is preferable that $R^3$ and $R^5$ are organic groups, but in terms of solubility in an aqueous alkali solution, hydrogen atoms are preferable. In the present invention, both a hydrogen atom and an alkyl group may be present. By adjusting the amounts of hydrogen atoms and organic groups in $R^3$ and $R^5$, the dissolution rate in an aqueous alkali solution can be varied. Therefore, by such adjustment, a photosensitive resin composition having a moderate dissolution rate can be obtained. It is preferable that $R^3$ and $R^5$ each have a hydrogen atom within a range of 10% to 90%. In addition, when the number of carbon atoms in each of $R^3$ and $R^5$ is more than 20, the resulting resin tends to be insoluble in an aqueous alkali solution. From above, it is preferable that $R^3$ and $R^5$ each have at least one $C_{1-16}$ hydrocarbon group, and the rest is a hydrogen atom.

In addition, m in general formula (1) and l in general formula (3) each show the number of carboxyl groups and represent an integer of 0 to 2, more preferably 1 or 2. p in general formula (1) represents an integer of 0 to 4, q represents an integer of 1 to 4, and p+q>1. In general formulae (1) and (2), n represents the number of repeats of the structural unit of the polymer of the present invention, and is within a range of 10 to 100,000. When n is less than 10, the solubility of the polymer in an alkaline developing solution becomes too high. Accordingly, it may happen that no contrast is obtained between the exposed area and the unexposed area, making it impossible to form a desired pattern.

Meanwhile, when n is greater than 100,000, the solubility of the polymer in an alkaline developing solution becomes too low, whereby the exposed area is dissolved, making it impossible to form a desired pattern. Like this, in terms of the solubility of the polymer in an alkaline developing solution and also in terms of elongation improvement, it is preferable that n is within a range of 10 to 100,000, more preferably within a range of 20 to 1,000, and most preferably within a range of 20 to 100.

n in general formulae (1) and (2) can be easily calculated by measuring the weight average molecular weight (Mw) by gel permeation chromatography (GPC), a light scattering method, an X-ray small angle scattering method, or the like. When the molecular weight of the repeating unit is expressed as M, and the weight average molecular weight of the polymer as Mw, n=Mw/M.

In addition, the resin having a structure represented by general formula (1) or (2) as a main component may be end-capped with an end cap compound, such as a monoamine, an acid anhydride, an acid chloride, and a monocarboxylic acid. When the resin is end-capped with an end cap compound having a hydroxyl group, a carboxyl group, a sulfonic acid group, a thiol group, a vinyl group, an ethynyl group, or an allyl group, the dissolution rate of the resin in an aqueous alkali solution can be easily adjusted within a preferred range. It is preferable that the end cap compound is used in an amount of 0.1 mol % to 60 mol %, more preferably 5 mol % to 50 mol %, relative to all the amine components of the resin.

The end cap compound introduced into the polymer can be easily detected by the following method. For example, a polymer having introduced thereinto an end cap compound is dissolved in an acidic solution and decomposed into an amine component and an acid anhydride component, which are structural units of the polymer, and they are subjected to gas chromatography (GC) or NMR measurement, whereby the end cap compound can be easily detected. In addition to this, detection can also be easily performed by subjecting a polymer component having introduced thereinto an end cap compound directly to pyrolysis gas chromatograph (PGC), or infrared spectrum or $^{13}$CNMR spectrum measurement.

In addition, without reducing the heat resistance, the resin having a structure represented by general formula (1) or (2) as a main component of the present invention may also be copolymerized with a structure having an aliphatic group.

Examples of aliphatic diamines include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylenebis(aminocyclohexane), 4,4'-methylenebis(2-methylaminocyclohexane), 1,2-bis(2-aminoethoxy)ethane, THF-100, THF-140, THF-170, RE-600, RE-900, RE-2000, RP-405, RP-409, RP-2005, RP-2009, RT-1000, HE-1000, HT-1100, HT-1700-KH-511, Jeffamine ED-600, Jeffamine ED-900, Jeffamine ED-2003, Jeffamine EDR-148, Jeffamine EDR-176, polyoxypropylenediamine D-200, D-400, D-2000, and D-4000 (all trade names, manufactured by HUNTSMAN). Among them, in the case where a linear aliphatic alkyldiamine is used, flexibility is imparted, whereby the elongation at break is improved, and also the elastic modulus decreases, whereby the warping of a wafer is suppressed; therefore, this is preferable. These characteristics are effective for a multilayer or thick film. At the time of introduction, it is preferable that in all the diamine residues, the proportion of residues derived from the aliphatic alkyldiamine is 10 mol % or more. In terms of heat resistance, the proportion is preferably 50 mol % or less.

Further, in order to improve the adhesion with a substrate, without reducing the heat resistance, the structure represented by general formula (1) or (2) may be copolymerized with a structure containing an aliphatic group having a siloxane structure. Specifically, one prepared by copolymerization with, as a diamine component, 1 to 10 mol % of bis(3-aminopropyl)tetramethyldisiloxane, bis(p-aminophenyl)octamethylpentasiloxane, or the like can be mentioned.

The resin having a structure represented by general formula (1) as a main component is synthesized by any of the following methods. In the case of polyamic acid or a polyamic acid ester, for example, a method in which a tetracarboxylic dianhydride and a diamine compound are allowed to react at a low temperature, a method in which a diester is obtained from a tetracarboxylic dianhydride and an alcohol, and then allowed to react with an amine in the presence of a condensing agent, and a method in which a diester is obtained from a tetracarboxylic dianhydride and an alcohol, and then the remaining dicarboxylic acid is converted into an acid chloride and allowed to react with an amine, and the like are possible.

As a heat-resistant polymer precursor similar to polyamic acid, it is also possible to use polyhydroxyamide in place of polyamic acid. In the case of polyhydroxyamide, it can be obtained by a production method in which a bisaminophenol compound and a dicarboxylic acid are subjected to a condensation reaction. Specifically, a method in which a dehydration condensing agent, such as dicyclohexylcarbodiimide (DCC), is allowed to react with an acid, and a bisaminophenol compound is added thereto, a method in which a solution of a dicarboxylic dichloride is added dropwise to a solution of a bisaminophenol compound having added thereto a tertiary amine such as pyridine, and the like are possible.

The resin having a structure represented by general formula (2) as a main component contains a closed-ring polyimide structure. Therefore, it can be synthesized utilizing a method in which the above polyimide precursor is obtained and then subjected to a known imidization reaction.

It is preferable that the resin having a structure represented by general formula (1) or (2) as a main component is, after polymerization by the above method, placed in a large amount of water, a mixed solution of methanol/water, or the like, precipitated, separated by filtration, dried, and isolated. As a result of this precipitate operation, unreacted monomers and oligomer components, such as dimers and trimers, are removed, and the film characteristics after heat curing are improved.

The photosensitive resin composition of the present invention may also contain other alkali-soluble resins besides the resin having a structure represented by general formula (1) or (2) as a main component. Specific examples thereof include polyamides, acrylic polymers copolymerized with acrylic acid, a novolac resin, a resole resin, a siloxane resin, a polyhydroxystyrene resin, resins obtained by introducing a crosslinking group, such as a methylol group, an alkoxymethyl group, an epoxy group, or an acrylic group, into these resins, and copolymers thereof. These resins dissolve in an aqueous solution of an alkali, such as tetramethylammonium hydroxide, choline, triethylamine, dimethylaminopyridine, monoethanolamine, diethylaminoethanol, sodium hydroxide, potassium hydroxide, or sodium carbonate. When such an alkali-soluble resin is contained, while maintaining the adhesion and the excellent sensitivity of a cured film, the characteristics of each alkali-soluble resin can be imparted. Of the resins contained in the photosensitive resin composition of the present invention, it is preferable that a proportion of the resin having a structure represented by general formula (1) or (2) as a main component is 30 wt % or more.

In the photosensitive resin composition of the present invention, a quinonediazide compound is used as a photosensitizer (b). Examples of quinonediazide compounds include a polyhydroxy compound with the sulfonic acid of quinonediazide linked thereto via an ester bond, a polyamino compound with the sulfonic acid of quinonediazide linked thereto via a sulfonamide bond, and a polyhydroxypolyamino compound with the sulfonic acid of quinonediazide linked thereto via an ester bond and/or a sulfonamide bond. The functional groups of such a polyhydroxy compound or polyamino compound do not necessarily have to be all substituted with quinonediazide, but it is preferable that 50 mol % or more of all the functional groups are substituted with quinonediazide. When the proportion is less than 50 mol %, the solubility in an alkaline developing solution becomes too high. Accordingly, it may happen that no contrast is obtained with the unexposed area, making it impossible to obtain a desired pattern. By using such a quinonediazide compound, a positive-working photosensitive resin composition sensitive to the i-line (365 nm), h-line (405 nm), and g-line (436 nm) of a mercury lamp, which are general UV rays, can be obtained.

Examples of polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (all trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (all trade names, manufactured by Asahi Yukizai Corporation), 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, and BisP-AP (trade name, manufactured by Honshu Chemical Industry Co., Ltd.).

Examples of polyamino compounds include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenyl sulfide.

In addition, examples of polyhydroxypolyamino compounds include, but are not limited to, 2,2-bis(3-amino-4-hydroxyphenyl)hexafluoropropane and 3,3'-dihydroxybenzidine.

As quinonediazide in the present invention, both a 5-naphthoquinonediazidesulfonyl group and a 4-naphthoquinonediazidesulfonyl group are preferably used. A 4-naphthoquinonediazidesulfonyl ester compound has absorption in the i-line region of a mercury lamp and is suitable for i-line exposure. A 5-naphthoquinonediazidesulfonyl ester compound further has absorption in the g-line region of a mercury lamp and is suitable for g-line exposure. In the present invention, it is preferable that a 4-naphthoquinonediazidesulfonyl ester compound or a 5-naphthoquinonediazidesulfonyl ester compound is selected according to the exposure wavelength. In addition, it is possible to obtain a naphthoquinonediazidesulfonyl ester compound having both a 4-naphthoquinonediazidesulfonyl group and a 5-naphthoquinonediazidesulfonyl group in one molecule, and it is also possible to use a mixture of a 4-naphthoquinonediazidesulfonyl ester compound and a 5-naphthoquinonediazidesulfonyl ester compound.

In addition, it is preferable that the quinonediazide compound has a molecular weight of 300 to 1,500. When the molecular weight is 1,500 or less, the quinonediazide compound is sufficiently pyrolyzed in the heat treatment after pattern formation, whereby a cured film having excellent heat resistance, mechanical characteristics, and adhesion can be obtained. The molecular weight is still more preferably 350 to 1,200.

In addition, it is preferable that the content of the quinonediazide compound (b) is 1 part by weight or more and 80 parts by weight or less, still more preferably within a range of 3 parts by weight or more and 60 parts by weight or less, relative to 100 parts by weight of the resin as the component (a).

The quinonediazide compound used in the present invention is synthesized from a specific phenolic compound by the following method. For example, a method in which 5-naphthoquinonediazidesulfonyl chloride is allowed to react with a phenol compound in the presence of triethylamine or the like is possible. As the synthesis method for a phenol compound, a method in which an α-(hydroxyphenyl) styrene derivative and a polyhydric phenol compound are allowed to react in the presence of an acid catalyst or the like is possible.

The photosensitive resin composition of the present invention contains a thermal crosslinker (c). In the present invention, it is preferable to use an alkoxymethyl-group-containing compound as the component (c). When such a compound is contained, the residual film rate at the time of curing is improved, and an excellent pattern shape is obtained. In addition, when a thermally crosslinkable compound, such as the component (c), is contained, the resulting photosensitive resin composition is hardly soluble in an alkaline developing solution before exposure, and, after being exposed, becomes easily soluble in an alkaline developing solution. Therefore, the film loss due to development can be reduced, and also development can be completed within a short period of time. In addition, the film undergoes less shrinkage after curing.

Further, it is preferable that the alkoxymethyl-group-containing compound as the component (c) in the present invention contains both a compound having a phenolic hydroxyl group and a compound having a urea-based organic group represented by N(C=O) N. Because of the compound having a phenolic hydroxyl group, the crosslinkability of the alkoxymethyl group is improved, making it possible to perform heat-curing at lower temperatures. In addition, in the compound having a urea-based organic group, a phenolic hydroxyl group is not present after the heating treatment, making it possible to impart high heat resistance. When these compounds are both present, the resulting photosensitive resin composition has high heat resistance even after low-temperature curing.

In addition, in the case where the alkoxymethyl-group-containing compound contains both a compound having a phenolic hydroxyl group and a compound having a urea-based organic group, solubility variation occurs between the surface and interior of the coating film. At this time, a hardly soluble layer is formed on the surface of the coating film. Accordingly, the dissolution contrast between the unexposed area and the exposed area is improved, whereby the sensitivity is improved.

Examples of the alkoxymethyl-group-containing compound containing a phenolic hydroxyl group are, but not limited to, the following compounds.

[Chemical Formula 9]

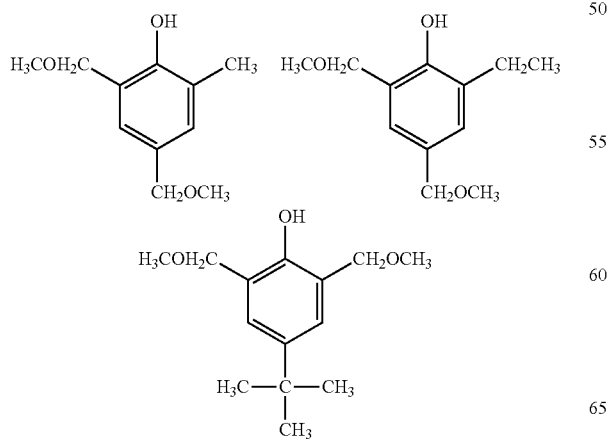

-continued

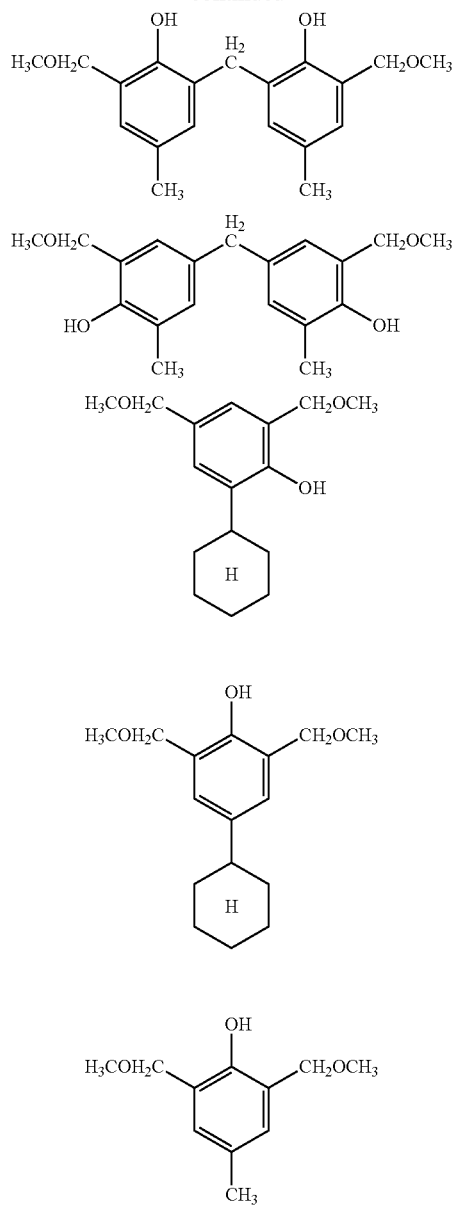

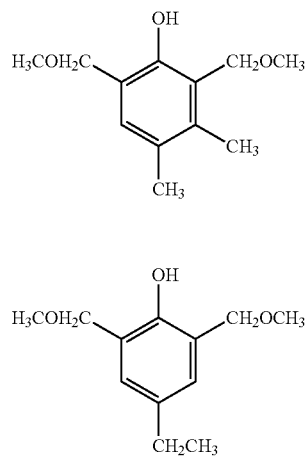

17
-continued
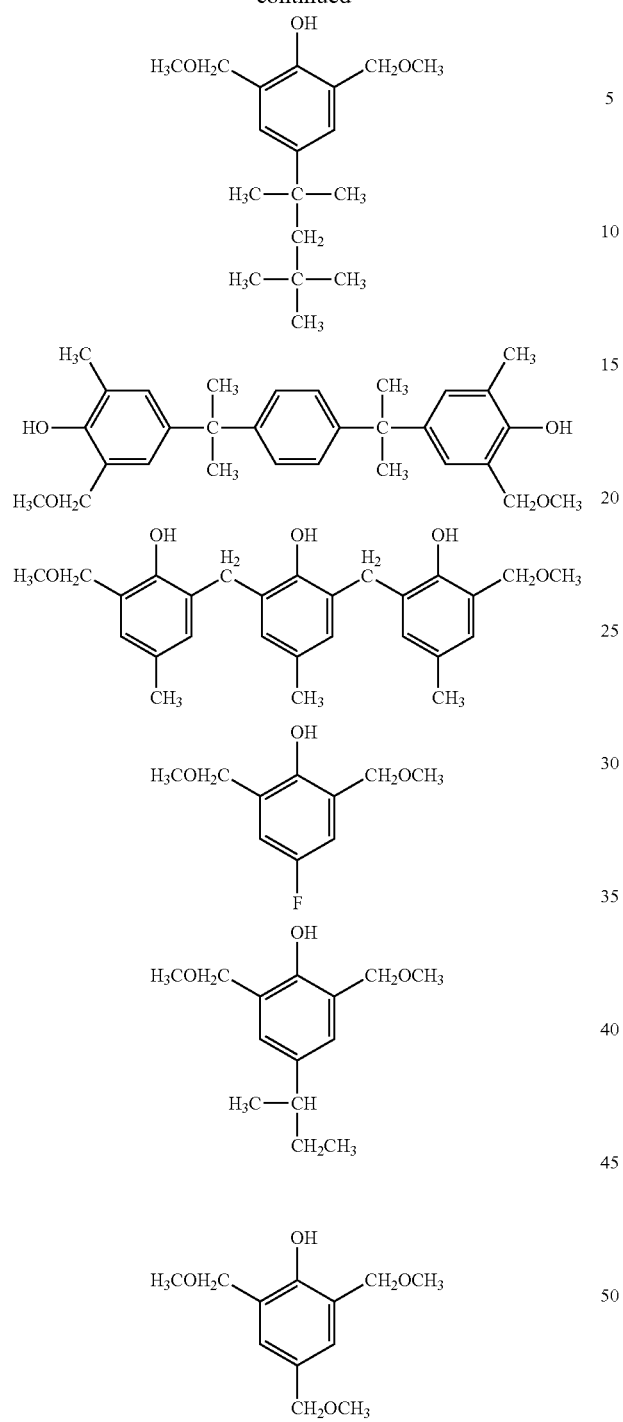
[Chemical Formula 10]
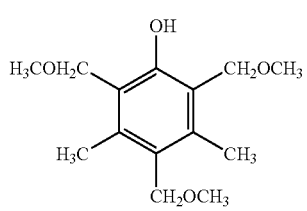
18
-continued
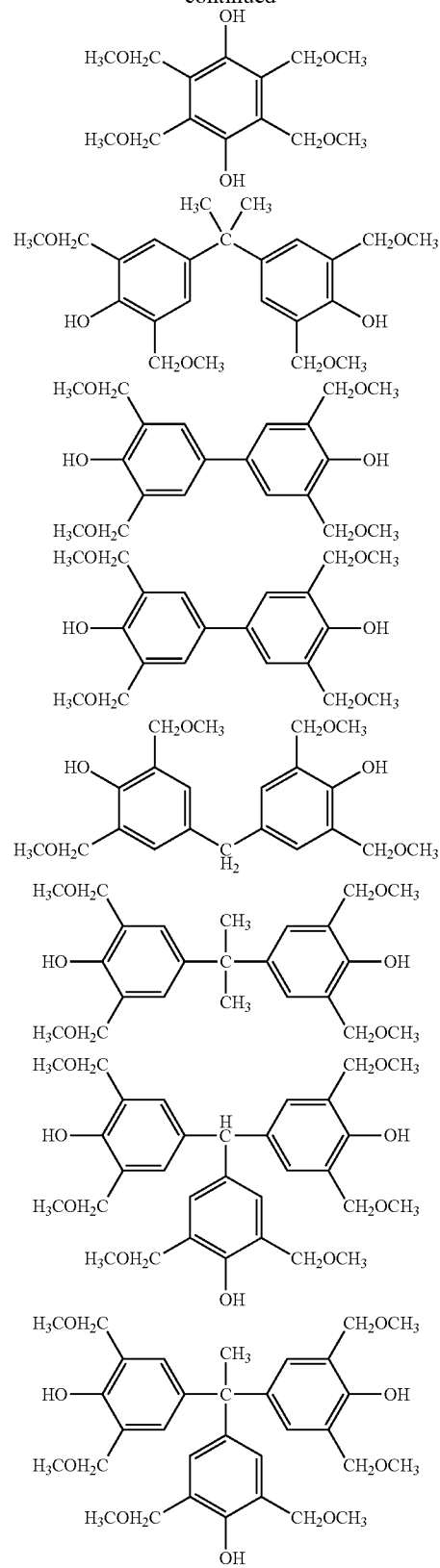
Specific examples of the alkoxymethyl-group-containing compound having a urea-based organic group are, but not limited to, the following compounds.

[Chemical Formula 11]

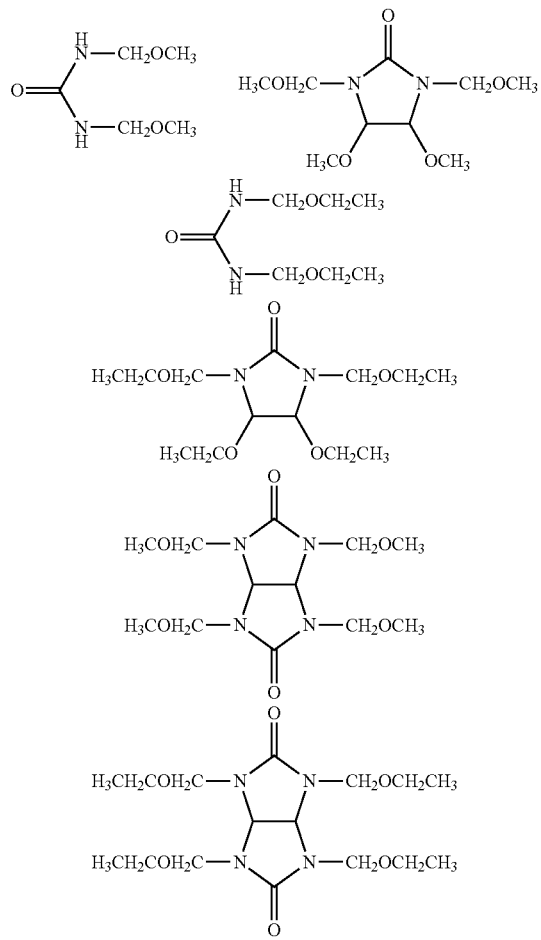

The content of the alkoxymethyl-group-containing compound is preferably 0.5 parts by weight or more and 100 parts by weight or less, still more preferably within a range of 1 part by weight or more and 70 parts by weight or less, relative to 100 parts by weight of the resin as the component (a). When the compound is used within this range, sufficient crosslinking occurs with the resin, and a dissolution contrast can be obtained between the exposed area and the unexposed area. Accordingly, high heat resistance and sensitivity can be obtained.

Examples of the solvent for use as the component (d) of the present invention include polar aprotic solvents such as N-methyl-2-pyrrolidone, γ-butyrolactone, N,N-dimethylformamide, N,N-dimethylacetamide, and dimethyl sulfoxide, ethers such as tetrahydrofuran, dioxane, and propylene glycol monomethyl ether, ketones such as acetone, methyl ethyl ketone, diisobutyl ketone, and diacetone alcohol, esters such as ethyl acetate, propylene glycol monomethyl ether acetate, and ethyl lactate, and aromatic hydrocarbons such as toluene and xylene. These solvents may be used alone or as a mixture.

The content of the solvent used in the present invention is preferably 50 parts by weight to 2,000 parts by weight, particularly preferably 100 parts by weight to 1,500 parts by weight, relative to 100 parts by weight of the resin as the component (a).

In the present invention, in addition to the components (a) to (d), it is also possible to use a compound selected from a compound represented by the following general formula (6) or (7) and a vinylsilane compound. Such a component may serve as a component that improves adhesion with a substrate.

[Chemical Formula 12]

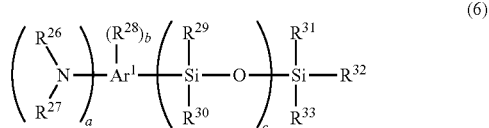

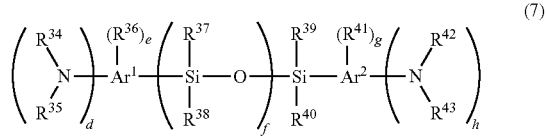

$Ar^1$ and $Ar^2$ in general formulae (6) and (7) each represent an aromatic ring having six or more carbon atoms or an aromatic heterocyclic structure having two or more carbon atoms. Specific examples thereof include, but are not limited to, a phenyl group, a naphthalene group, a biphenyl group, a triazine group, and a pyridine group.

$R^{26}$, $R^{27}$, $R^{34}$, $R^{35}$, $R^{42}$, and $R^{43}$ each in general formulae (6) and (7) may be the same or different and represent a hydrogen atom or a $C_{1-4}$ organic group. Specific examples of $C_{1-4}$ organic groups include hydrocarbons, such as a methyl group, an ethyl group, and a propyl group, and carbonyl groups, such as an acetyl group. When the number of carbon atoms is 5 or more, the film shrinkage at the time of curing increases, so care must be taken. $R^{28}$, $R^{36}$, and $R^{41}$ each may be the same or different and represent a $C_{1-6}$ organic group, and $R^{29}$ to $R^{33}$ and $R^{37}$ to $R^{40}$ each may be the same or different and represent a $C_{1-6}$ hydrocarbon group, a $C_{1-6}$ alkoxy group, or a phenyl group. Further, at least one of $R^{29}$ to $R^{33}$ and $R^{37}$ to $R^{40}$ has a $C_{1-6}$ alkoxy group. a, d, f, and h each represent an integer of 1 or more, and b, c, e, and g each represent an integer of 0 or more, with the proviso that $1 \leq a+b \leq 4$, $1 \leq d+e \leq 4$, and $1 \leq g+h \leq 4$. Specific examples of hydrocarbon groups include, but are not limited to, a methyl group, an ethyl group, and a propyl group.

Specific examples of alkoxy groups include, but are not limited to, a methoxy group, an ethoxy group, an n-propoxy group, an isopropoxy group, an n-butoxy group, and an isobutoxy group. When the number of carbon atoms in the hydrocarbon group or the alkoxy group is 7 or more, the film shrinkage at the time of curing increases, so care must be taken. Preferred specific examples of compounds represented by general formula (6) or (7) are, but not limited to, the following compounds.

[Chemical Formula 13]

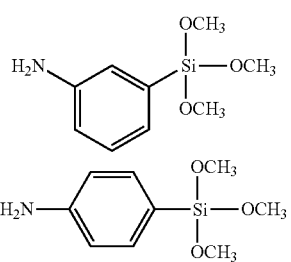

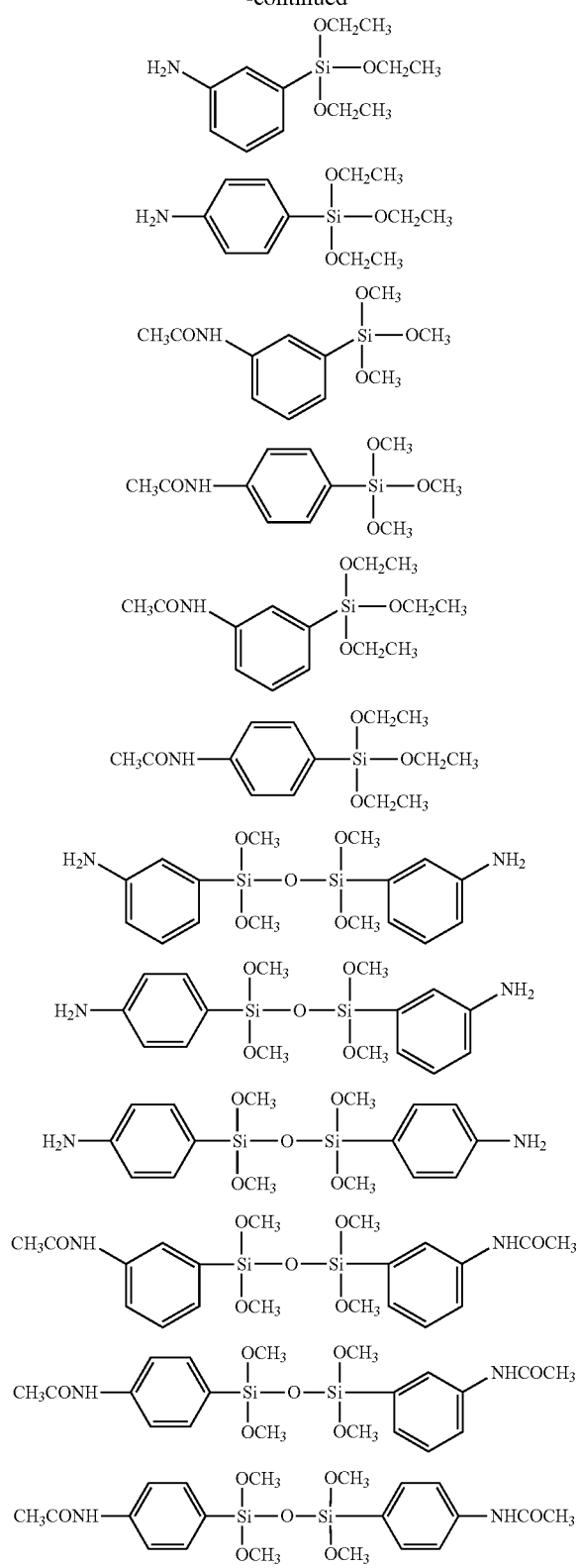

Among them, the following structures are the most preferable.

[Chemical Formula 14]

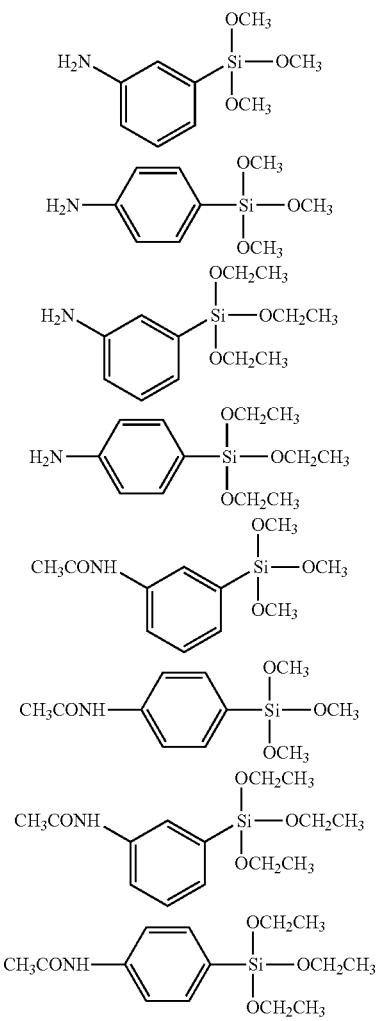

In addition, examples of vinylsilane compounds include vinyltrimethoxysilane, vinyltriethoxysilane, vinyltrichlorosilan, and vinyltris(β-methoxyethoxy)silane. In addition to them, silane compounds having a carbon-carbon unsaturated bond, such as 3-methacryloxypropyltrimethoxysilane, 3-acryloxypropyltrimethoxysilane, p-styryltrimethoxysilane, 3-methacryloxypropylmethyldimethoxysilane, and 3-methacryloxypropylmethyldiethoxysilane, are also usable. Vinyltrimethoxysilane and vinyltriethoxysilane are preferable.

The compound represented by general formula (6) or (7) and the vinylsilane compound may each be used alone or may also be used together. In any case, excellent adhesion is developed for various substrates.

It is preferable that the compound represented by general formula (6) or (7) and the vinylsilane compound as described above are each contained in an amount of 0.001 parts by weight or more and 30 parts by weight or less relative to 100 parts by weight of the resin as the component (a). Within this range, a sufficient adhesion-improving effect can be obtained while maintaining the heat resistance of the composition. The amount is more preferably 0.005 parts by weight or more and 20 parts by weight or less, and still more preferably 0.01 parts by weight or more and 15 parts by weight or less.

The photosensitive resin composition of the present invention may also contain a photoacid generator selected from sulfonium salts, phosphonium salts, and diazonium salts. When such a photoacid generator is contained, sensitivity degradation due to post-exposure standing can be reduced. A resin composition obtained from the photosensitive resin composition of the present invention is used as a permanent film, and thus the presence of remaining phosphorus, etc., is environmentally undesirable. In addition, because the hue of the film also has to be considered, among them, it is preferable to use a sulfonium salt. Among sulfonium salts, triarylsulfonium salts represented by general formula (11) are particularly preferable.

[Chemical Formula 15]

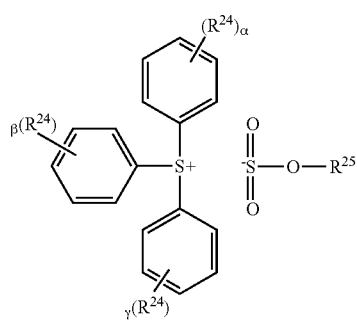

(11)

In the formula, $R^{24}$ each may be the same or different and represent a hydrogen atom or a $C_{1-20}$ organic group. $R^{25}$ represents a $C_{1-20}$ organic group. α, β, and γ each represent an integer of 0 to 5.

Specific examples of triarylsulfonium salts represented by general formula (11) are, but not limited to, the following.

[Chemical Formula 16]

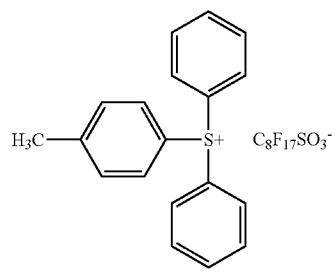

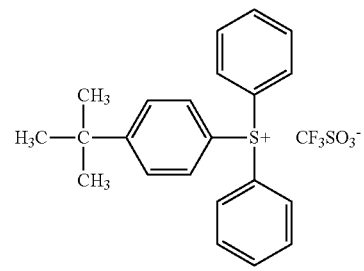

-continued

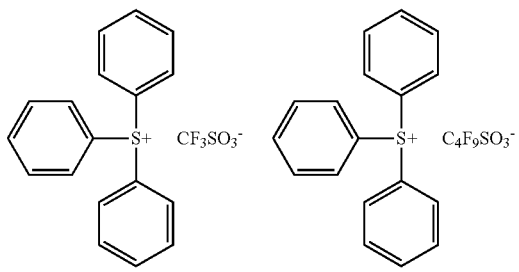

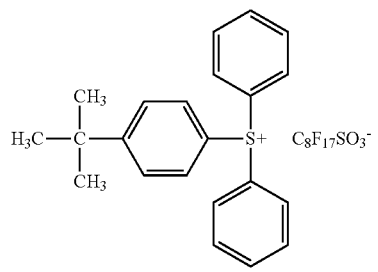

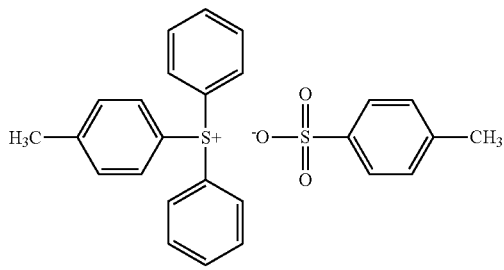

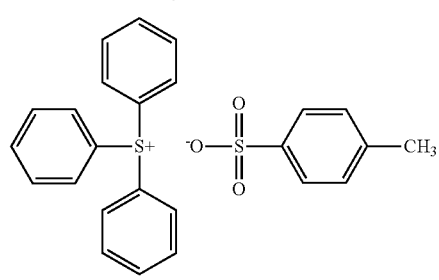

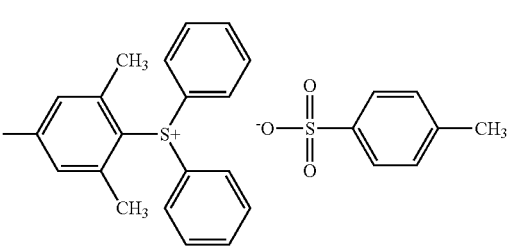

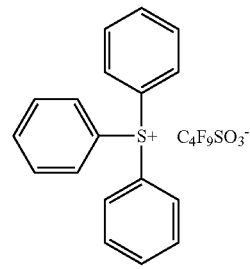

-continued

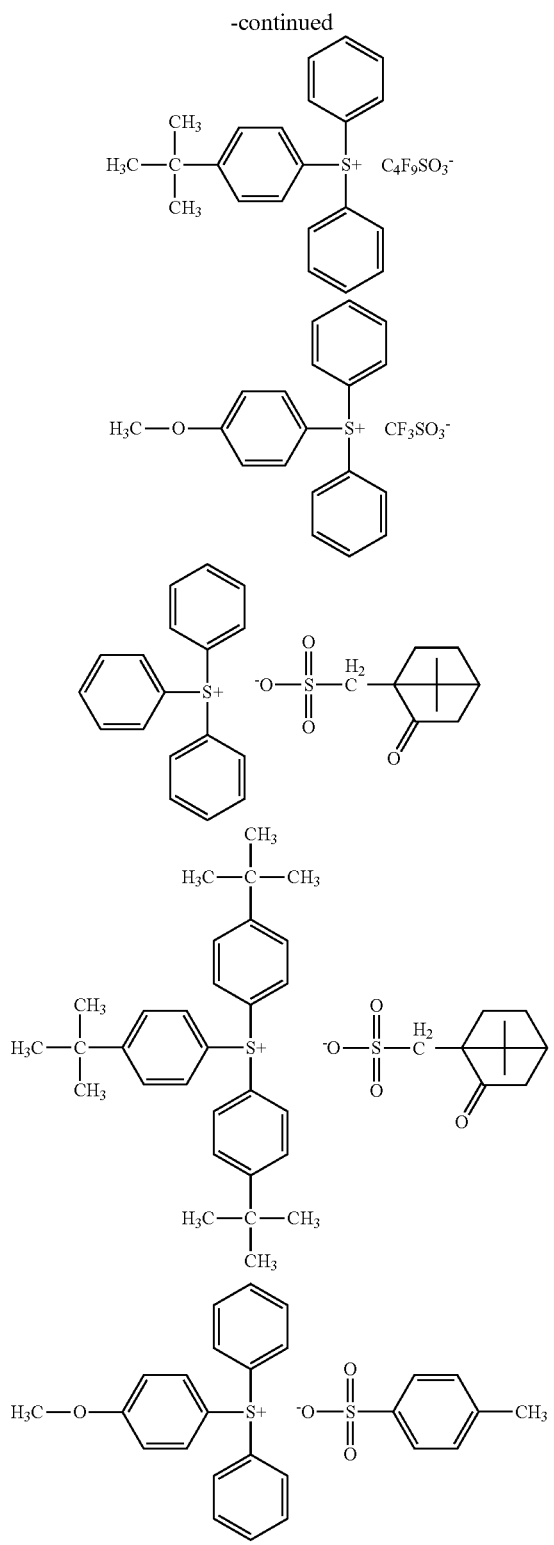

In the present invention, it is preferable that the content of the photoacid generator selected from a sulfonium salt, a phosphonium salt, and a diazonium salt is 0.01 parts by weight or more and 50 parts by weight or less relative to 100 parts by weight of the resin as the component (a). The content is still more preferably within a range of 0.05 parts by weight or more and 10 parts by weight or less.

In addition, as necessary, for the purpose of improving the sensitivity of the photosensitive resin composition, a compound having a phenolic hydroxyl group may be added.

Examples of the compound having a phenolic hydroxyl group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (Tetrakis P-DO-BPA), TrisP-HAP, TrisP-PA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236 T-OCHP, Methylenetris FR-CR, BisRS-26X, BisRS-OCHP, (all trade names, manufactured by Honshu Chemical Industry Co., Ltd.), and BIR-OC, BIP-PC, BIR-PC, BIR-PTBP, BIR-PCHP, BIP-BIOC-F, 4PC, BIR-BIPC-F, and TEP-BIP-A (all trade names, manufactured by Asahi Yukizai Corporation).

Among them, preferred examples of the compound having a phenolic hydroxyl group for use in the present invention include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, BIP-PC, BIR-PC, BIR-PTBP, and BIR-BIPC-F. Among them, particularly preferred examples of the compound having a phenolic hydroxyl group include Bis-Z, TekP-4HBPA, TrisP-HAP, TrisP-PA, BisRS-2P, BisRS-3P, BIR-PC, BIR-PTBP, and BIR-BIPC-F. When the compound having a phenolic hydroxyl group is added, the resulting resin composition is hardly soluble in an alkaline developing solution before exposure, and, after being exposed, becomes easily soluble in an alkaline developing solution. Therefore, the film loss due to development can be reduced, and also development can be completed easily within a short period of time.

The amount of the compound having a phenolic hydroxyl group added is preferably 1 part by weight or more and 50 parts by weight or less, still more preferably within a range of 3 parts by weight or more and 40 parts by weight or less, relative to 100 parts by weight of the resin as the component (a).

In addition, as necessary, for the purpose of improving the wettability between the photosensitive composition and a substrate, it is also possible to contain surfactants, esters such as an ethyl lactate and propylene glycol monomethyl ether acetate, alcohols such as ethanol, ketones such as cyclohexanone and methyl isobutyl ketone, and ethers such as tetrahydrofuran and dioxane. In addition, it is also possible to contain inorganic particles such as silicon dioxide and titanium dioxide, a polyimide powder, or the like.

Further, in order to enhance the adhesion with the base substrate, such as a silicon wafer, the base substrate may be pretreated with an adhesion-improving component used in the present invention, for example. In this case, the adhesion-improving component described above is dissolved at a concentration of 0.5 wt % to 20 wt % in a solvent such as isopropanol, ethanol, methanol, water, tetrahydrofuran, propylene glycol monomethyl ether acetate, propylene glycol monomethyl ether, ethyl lactate, or diethyl adipate, and the resulting solution is applied by spin coating, immersion, spray coating, steaming, or the like to treat the surface. In some cases, heating is then performed to 50° C. to 300° C., thereby allowing the reaction between the substrate and the adhesion-improving component to proceed.

Next, a method for forming a patterned cured film using the photosensitive resin composition of the present invention will be described.

The photosensitive resin composition is applied onto the substrate. Examples of usable substrates include, but are not limited to, a silicon wafer, ceramics, gallium arsenide, metal, glass, a metal oxide insulating film, silicon nitride, and ITO. As coating methods, spin coating using a spinner, spray coating, roll coating, slit-die coating, and the like can be mentioned. In addition, although the coating film thickness depends on the coating technique, the solids concentration and the viscosity of the composition, and the like, coating is usually performed such that the thickness after drying is 0.1 μm to 150 μm.

Next, the substrate coated with the photosensitive resin composition is dried to give a photosensitive resin film. It is preferable that drying is performed using an oven, a hot plate, infrared radiation, or the like at a temperature of 50° C. to 150° C. for 1 minute to several hours.

Next, actinic rays are applied onto the photosensitive resin film through a mask having a desired pattern. Examples of actinic rays used for exposure include UV rays, visible rays, electron rays, and X-rays. However, in the present invention, it is preferable to use the i-line (365 nm), h-line (405 nm), and g-line (436 nm) of a mercury lamp.

The formation of a patterned resin film from the photosensitive resin film is achieved by removing the exposed area using a developing solution after exposure. Preferred examples of the developing solution include an aqueous solution of tetramethylammonium and aqueous solutions of alkaline compounds such as diethanolamine, diethylamino ethanol, sodium hydroxide, potassium hydroxide, sodium carbonate, potassium carbonate, triethylamine, diethylamine, primary amine, dimethylamine, dimethylaminoethyl acetate, dimethylamino ethanol, dimethylaminoethyl methacrylate, cyclohexylamine, ethylenediamine, and hexamethylenediamine. In addition, in some cases, one of or a combination of several kinds of polar solvents such as N-methyl-2-pyrrolidone, N,N-dimethylformamide, N,N-dimethylacetamide, dimethyl sulfoxide, γ-butyrolactone, and dimethyl acrylamide, alcohols such as methanol, ethanol, and isopropanol, esters such as ethyl lactate and propylene glycol monomethyl ether acetate, ketones such as cyclopentanone, cyclohexanone, isobutyl ketone, and methyl isobutyl ketone, and the like may be added to these aqueous alkaline solutions. The development is followed by a rinsing treatment with water. Also here, alcohols such as ethanol and isopropyl alcohol, esters such as ethyl lactate and propylene glycol monomethyl ether acetate, and the like may be added to water to perform the rinsing treatment.

After development, the obtained patterned resin film is heated at a temperature of 200° C. to 500° C. and thus converted into a patterned cured film. This heating treatment is performed for 5 minutes to 5 hours while heating the film stepwise or continuously heating the film within a certain temperature range. As examples, a method in which the film is heat-treated at 130° C., 200° C., and 350° C. each for 30 minutes, a method in which the film is linearly heated from room temperature to 400° C. over 2 hours, and the like can be mentioned. In addition, due to high-temperature heating and its repetition, it may happen that the electrical characteristics of the device change, or warping of the substrate is increased. Therefore, it is preferable that the heating treatment is performed at 250° C. or less.

A patterned cured film formed from the photosensitive resin composition of the present invention is used for applications such as a passivation film of a semiconductor, a protective film of a semiconductor device, an interlayer dielectric film for multilayer interconnection for high-density packaging, an insulating layer of an organic electroluminescent element, etc.

Next, an example of application to a semiconductor device having bumps using the photosensitive resin composition of the present invention will be described with reference to drawings. FIG. 1 is an enlarged cross-sectional view of a pad portion of the semiconductor device having bumps of the present invention.

As shown in FIG. 1, on a silicon wafer 1, a passivation film 3 is formed on an Al pad 2 for input/output, and a via hole is formed in the passivation film 3. Further, a pattern (insulating film) 4 made of the photosensitive resin composition of the present invention is formed thereon, and further a metal (Cr, Ti, etc.) film 5 is formed to connect with the Al pad 2. As a result of etching the periphery of a solder bump 10, the metal film 5 insulates each pad. On the insulated pad, a barrier metal 8 and a solder bump 10 are formed.

In the case where a soft component has been introduced into the photosensitive resin composition, the warping of the wafer is reduced. Accordingly, exposure and wafer conveyance can be accurately performed. In addition, a polyimide resin also has excellent mechanical characteristics, and thus can relax stress from the sealing resin also at the time of mounting. Accordingly, damage to the low-k layer can be prevented, and a highly reliable semiconductor device can be provided.

Next, a method for making a semiconductor device will be described in detail. As shown in 2c of FIG. 2, a metal trace 6 is formed by a plating method. Next, the photosensitive resin composition of the present invention is applied, and, through a photolithography step, a pattern (insulating film 7) as shown in FIG. 2, 2d, is formed. In the case of forming a multilayer interconnection structure including three or more layers, the above step can be repeated to form each layer.

Subsequently, as shown in FIGS. 2, 2e and 2f, a barrier metal 8 and a solder bump 10 are formed. Then, the wafer is diced into chips along the final scribe line 9.

EXAMPLES

Hereinafter, the present invention will be described with reference to examples, etc., but the present invention is not limited by these examples. Incidentally, in the examples, resins and photosensitive resin compositions were evaluated by the following methods.

<Film Thickness Measurement Method>

Using "Lambda Ace" STM-602 manufactured by Dainippon Screen Mfg. Co., Ltd., the film thickness after prebaking, development, and curing was measured, with the refractive index being 1.629.

<Production of Developed Film A>

A varnish was applied onto an 8-inch silicon wafer by spin coating and then baked on a hot plate at 120° C. (using Application/Development Device Act-8 manufactured by Tokyo Electron Limited) for 3 minutes, thereby producing a prebaked film having a thickness of 9 μm. Using an i-line stepper (Nikon NSR i9), the film was exposed in steps of 10 mJ/cm$^2$ with an exposure dose of 0 to 1,000 mJ/cm$^2$. After the exposure, development was performed with a 2.38 wt % aqueous tetramethylammonium (TMAH) solution (ELM-D manufactured by Mitsubishi Gas Chemical) for 90 seconds, followed by rinsing with pure water, thereby giving a developed film having a 50 μm isolated pattern.

(1) Sensitivity Evaluation

In the developed film, after exposure and development, the exposure dose at which the exposed part was completely dissolved away (referred to as "minimum exposure dose Eth") was defined as sensitivity. When Eth is 400 mJ/cm$^2$ or less, the sample can be judged as having high sensitivity. Eth is more preferably 300 mJ/cm$^2$ or less.

(2) Evaluation of Residual Film Rate

The ratio of the thickness of a developed film relative to a prebaked film was defined as a residual film rate (residual film rate=(thickness of developed film)/(thickness of prebaked film)×100). Samples having 80% or more were rated as acceptable.

(3) Evaluation of Heat Resistance

<Production of Heat-Resistant Resin Coating Film>

A varnish was applied onto a 6-inch silicon wafer such that the film thickness after prebaking would be 10 µm and then prebaked using a hot plate at 120° C. (Application/Development Device Mark-7 manufactured by Tokyo Electron Limited) for 3 minutes, thereby giving a photosensitive resin film. Subsequently, development was performed by the above method. Then, using Inert Oven INH-21CD manufactured by manufactured by Koyo Thermo Systems Co., Ltd., in a nitrogen gas stream (oxygen concentration: 20 ppm or less), the produced photosensitive resin film was heat-treated at 140° C. for 30 minutes, then heated to 350° C. over 1 hour, and heat-treated at 250° C. for 1 hour, thereby producing a heat-resistant resin coating film (cured film).

<Production of Measurement Sample>

The heat-resistant resin coating film (cured film) produced on a silicon wafer was immersed in 47% hydrofluoric acid at room temperature for 7 minutes, then washed with water, and carefully stripped from the silicon wafer.

<Measurement of Heat Weight Loss>

(3)-1. Measurement of Heat Loss Temperature

The obtained cured film was placed in an Al cell for TGA measurement, and measurement was performed under the following conditions using a thermogravimetric analyzer (TGA) to measure the 5% weight loss temperature from the initial weight.

Device: TGA-50 (manufactured by Shimadzu Corporation)

Heating profile: Heating from 30° C. to 450° C. at 20° C./min

Condition: Flow gas, nitrogen (flow before measurement: 10 min).

When the 5% weight loss temperature was 400° C. or higher, the sample was rated as excellent (◯), when the temperature was 370° C. or higher and lower than 400° C., the sample was rated as insufficient (Δ), and when the temperature was lower than 370° C., the sample was rated as unacceptable (x).

(3)-2. Measurement of Glass Transition Point

The cured film obtained in (3) was cut into 15×30 mm, and a cylindrical shape 1 mm in length and about 3 mm in diameter was subjected to measurement using a thermomechanical analyzer (TMA) under the following conditions to determine the glass transition temperature.

Device: TMASS-6100 (manufactured by Seiko Instruments & Electronics)

Heating profile: Heating from 30° C. to 300° C. at 20° C./min

Condition: Flow gas, nitrogen (flow before measurement: 10 min).

When Tg was 280° C. or higher, the sample was rated as extremely excellent (⊙), when Tg was 260° C. or higher and lower than 280° C., the sample was rated as excellent (◯), and when Tg was lower than 260° C., the sample was rated as unacceptable (x).

The abbreviations of acid dianhydrides and diamines shown in the following examples and comparative examples are as follows.

6FDA: 4,4'-(Hexafluoroisopropylidene)diphthalic anhydride

ODPA: 3,3',4,4'-Diphenylethertetracarboxylic acid dianhydride

Si DA: 1,1,3,3-Tetramethyl-1,3-bis(3-aminopropyl)disiloxan

BAHF: 2,2-Bis(3-amino-4-hydroxyphenyl)hexafluoropropane

APBS: Bis(3-amino-4-hydroxyphenyl) Sulfone

DAE: 4,4'-Diaminodiphenyl ether

DDS: 3,3'-Sulfonyldianiline

NMP: N-methyl-2-pyrrolidone

KBM-403:3-Glycidoxypropyltrimethoxysilane.

Synthesis Example 1

Synthesis of Hydroxyl-Group-Containing Diamine (a)

18.3 g (0.05 mol) of BAHF was dissolved in 100 mL of acetone and 17.4 g (0.3 mol) of propylene oxide and cooled to −15° C. A solution of 20.4 g (0.11 mol) of 4-nitrobenzoyl chloride dissolved in 100 mL of acetone was added dropwise thereto. After the completion of dropwise addition, the mixture was allowed to react at −15° C. for 4 hours and then returned to room temperature. The deposited white solid was removed by filtration and vacuum-dried at 50° C.

30 g of the solid was placed in a 300-mL stainless steel autoclave and dispersed in 250 mL of methyl cellosolve, and 2 g of 5% palladium-carbon was added. Hydrogen gas was introduced thereinto using a balloon to carry out a reduction reaction at room temperature. About 2 hours later, after confirming that the balloon would not be deflated anymore, the reaction was completed. After the completion of the reaction, the mixture was filtered to remove the palladium compound (catalyst) and concentrated on a rotary evaporator, thereby giving a hydroxyl-group-containing diamine compound (a). The obtained solid was directly used for the reaction.

[Chemical Formula 17]

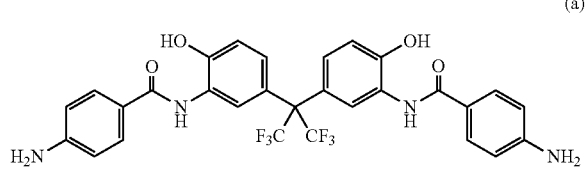

Hydroxyl-Group-Containing Diamine

Synthesis Example 2

Synthesis of Hydroxyl-Group-Containing Diamine (b)

15.4 g (0.1 mol) of 2-amino-4-nitrophenol was dissolved in 50 mL of acetone and 30 g (0.34 mol) of propylene oxide and cooled to −15° C. A solution of 11.2 g (0.055 mol) of isophthaloyl chloride dissolved in 60 mL of acetone was slowly added dropwise thereto. After the completion of dropwise addition, the mixture was allowed to react at −15°

C. for 4 hours. Subsequently, the mixture was returned to room temperature, and the resulting precipitate was collected by filtration.

This precipitate was dissolved in 200 mL of GBL, and 3 g of 5% palladium-carbon was added and vigorously stirred. A balloon containing hydrogen gas was attached thereto. Stirring was continued at room temperature until the hydrogen gas balloon stopped shrinking, and then stirring was performed for further 2 hours with the hydrogen gas balloon attached thereto. After the completion of stirring, the palladium compound was removed by filtration, and the solution was concentrated to half the volume on a rotary evaporator. Ethanol was added thereto to cause recrystallization, thereby giving crystals of the desired compound.

[Chemical Formula 18]

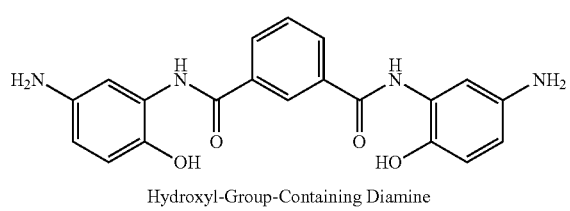

Hydroxyl-Group-Containing Diamine

Synthesis Example 3

Synthesis of Hydroxyl-Group-Containing Diamine (c)

15.4 g (0.1 mol) of 2-amino-4-nitrophenol was dissolved in 100 mL of acetone and 17.4 g (0.3 mol) of propylene oxide and cooled to −15° C. A solution of 20.4 g (0.11 mol) of 4-nitrobenzoyl chloride dissolved in 100 mL of acetone was slowly added dropwise thereto. After the completion of dropwise addition, the mixture was allowed to react at −15° C. for 4 hours. Subsequently, the mixture was returned to room temperature, and the resulting precipitate was collected by filtration. Subsequently, crystals of the desired compound were obtained in the same manner as in Synthesis Example 2.

[Chemical Formula 19]

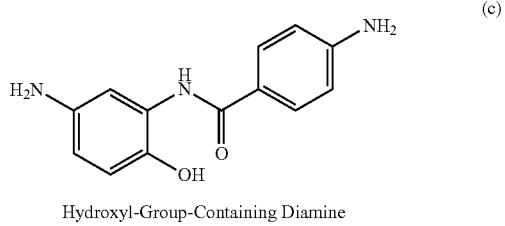

Hydroxyl-Group-Containing Diamine

Synthesis Example 4

Synthesis of Quinonediazide Compound (d)

In a dry nitrogen gas stream, 16.10 g (0.05 mol) of BisP-RS (trade name, manufactured by Honshu Chemical Industry Co., Ltd.) and 26.86 g (0.1 mol) of 5-naphthoquinonediazidesulfonyl acid chloride were dissolved in 450 g of 1,4-dioxane and turned to room temperature. 10.12 g of triethylamine mixed with 50 g of 1,4-dioxane was added dropwise thereto in such a manner that the temperature of the inside of the system would not be 35° C. or more. After the dropwise addition, the mixture was stirred at 30° C. for 2 hours. The triethylamine salt was filtered, and the filtrate was placed in water. Subsequently, the deposited precipitate was collected by filtration. The precipitate was dried with a vacuum dryer, thereby giving a quinonediazide compound (d).

[Chemical Formula 20]

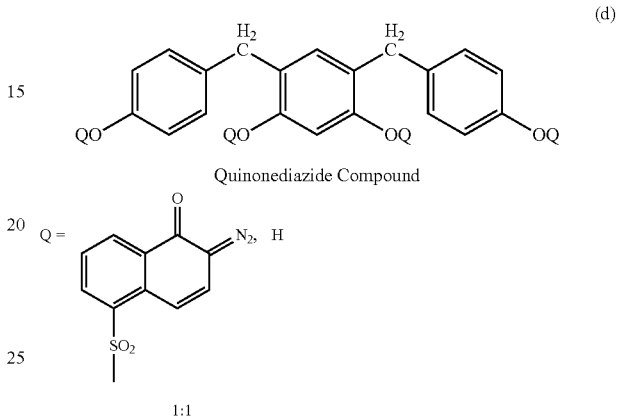

Quinonediazide Compound

1:1

Synthesis Example 5

Synthesis of Quinonediazide Compound (e)

In a dry nitrogen gas stream, 15.31 g (0.05 mol) of TrisP-HAP (trade name, manufactured by Honshu Chemical Industry Co., Ltd.) and 40.28 g (0.15 mol) of 5-naphthoquinonediazidesulfonyl acid chloride were dissolved in 450 g of 1,4-dioxane and turned to room temperature. 15.18 g of triethylamine mixed with 50 g of 1,4-dioxane was applied thereto, thereby giving a quinonediazide compound (e) in the same manner as in Synthesis Example 4.

[Chemical Formula 21]

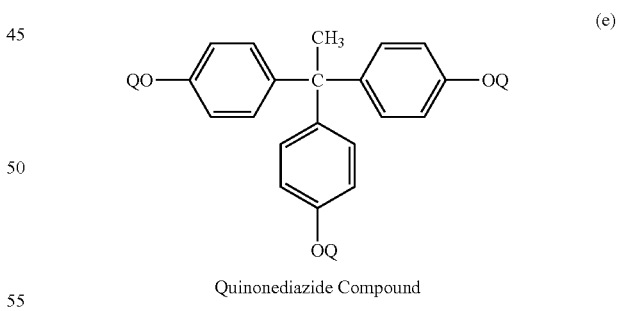

Quinonediazide Compound

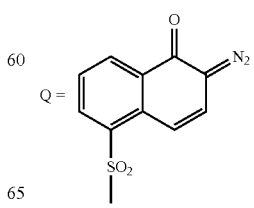

Synthesis Example 6

Synthesis of Quinonediazide Compound (f)

In a dry nitrogen gas stream, 21.22 g (0.05 mol) of TrisP-PA (trade name, manufactured by Honshu Chemical Industry Co., Ltd.), 26.86 g (0.10 mol) of 5-naphthoquinonediazidesulfonyl acid chloride, and 13.43 g (0.05 mol) of 4-naphthoquinonediazidesulfonyl acid chloride were dissolved in 450 g of 1,4-dioxane, and turned to room temperature. 12.65 g of triethylamine mixed with 50 g of 1,4-dioxane was applied thereto, and a quinonediazide compound (f) was obtained in the same manner as in Synthesis Example 4.

[Chemical Formula 22]

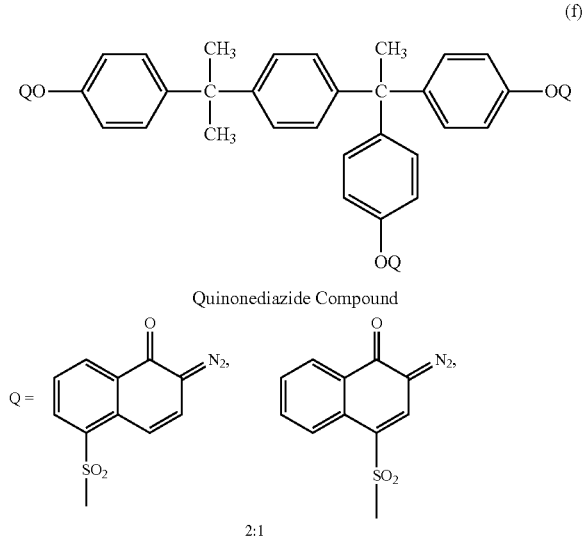

Synthesis Example 7

Synthesis of Quinonediazide Compound (g)

In a dry nitrogen gas stream, 11.41 g (0.05 mol) of bisphenol A and 26.86 g (0.1 mol) of 4-naphthoquinonediazidesulfonyl acid chloride were dissolved in 450 g of 1,4-dioxane, and turned to room temperature. 10.12 g of triethylamine mixed with 50 g of 1,4-dioxane was applied thereto, and a quinonediazide compound (g) was obtained in the same manner as in Synthesis Example 4.

[Chemical Formula 23]

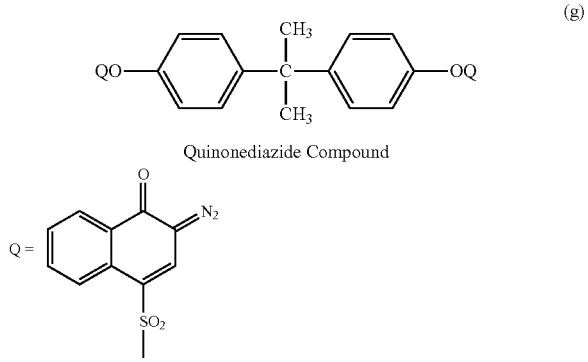

Synthesis Example 8

Synthesis of Acrylic Resin (h)

To a 500-ml flask, 5 g of 2,2'-azobis(isobutyronitrile), 5 g of t-dodecanethiol, and 150 g of propylene glycol monomethyl ether acetate (hereinafter abbreviated to PGMEA) were charged. Subsequently, 30 g of methacrylic acid, 35 g of benzyl methacrylate, and 35 g of tricyclo[5.2.1.0$^{2,6}$]decan-8-yl methacrylate were charged thereto, and the mixture was stirred at room temperature for a while. The inside of the flask was purged with nitrogen, followed by heating and stirring at 70° C. for 5 hours. Next, 15 g of glycidyl methacrylate, 1 g of dimethylbenzylamine, and 0.2 g of p-methoxy phenol were added to the obtained solution, and the mixture was heated and stirred at 90° C. for 4 hours, thereby giving an alkali-soluble acrylic resin (h) solution. The solids concentration of the acrylic resin solution (h) was 43 wt %.

Synthesis Example 9

Synthesis of Novolac Resin (i)

In a dry nitrogen gas stream, 70.2 g (0.65 mol) of m-cresol, 37.8 g (0.35 mol) of p-cresol, 75.5 g of a 37 wt % aqueous formaldehyde solution (formaldehyde: 0.93 mol), 0.63 g (0.005 mol) of oxalic acid dihydrate, and 264 g of methyl isobutyl ketone were charged and then immersed in an oil bath. While refluxing the reaction mixture, a polycondensation reaction was carried out for 4 hours. Subsequently, the temperature of the oil bath was raised over 3 hours, then the pressure in the flask was reduced to 40 to 67 hPa to remove volatiles, and the dissolved resin was cooled to room temperature, thereby giving a polymer solid of an alkali-soluble novolac resin (i). From GPC, Mw was 3,500.

γ-Butyrolactone (GBL) was added to the obtained novolac resin (i), thereby giving a novolac resin (i) solution having a solids concentration of 43 wt %.

Synthesis Example 10

Synthesis of Polyhydroxystyrene (j)

To a mixed solution of 500 ml of tetrahydrofuran and 0.01 mol of sec-butyllithium added as an initiator, p-t-butoxystyrene and styrene were added in a molar ratio of 3:1 in a total amount of 20 g, and the mixture was polymerized with stirring for 3 hours. For the cessation of the polymerization reaction, 0.1 mol of methanol was added to the reaction solution. Next, in order to purify the polymer, the reaction mixture was poured into methanol, and the precipitated polymer was dried. As a result, a white polymer was obtained. Further, the polymer was dissolved in 400 ml of acetone, and a small amount of concentrated hydrochloric acid was added at 60° C. and stirred for 7 hours. Subsequently, the mixture was poured into water to precipitate the polymer, and p-t-butoxystyrene was deprotected and converted into hydroxystyrene, followed by washing and drying. As a result, a purified copolymer of p-hydroxystyrene and styrene (j) was obtained.

Example 1

In a dry nitrogen gas stream, 10.99 g (0.03 mol) of BAHF, 2.48 g (0.01 mol) of DDS, and 0.62 g (0.003 mol) of SiDA were dissolved in 100 g of NMP. 15.51 g (0.05 mol) of ODPA was added thereto together with 10 g of NMP, allowed to react at 60° C. for 1 hour, and then stirred at 180° C. for 4 hours. After the completion of stirring, the solution was placed in 2 L of water, thereby giving a white precipitate. The precipitate was collected by filtration, washed three times with water, and then dried in a vacuum dryer at 50° C. for 72 hours, thereby giving a powder of a closed-ring polyimide resin (A).

17.5 g of the obtained resin (A), 2.3 g of the quinonediazide compound (d) obtained in Synthesis Example 4, 16 g of the acrylic resin (h) obtained in Synthesis Example 8, 4.0 g of crosslinker NIKALAC (registered trademark) MX-270, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The composition of the resin composition is shown in Table 1, and the evaluation results are shown in Table 2.

Example 2

In a dry nitrogen gas stream, 5.49 g (0.015 mol) of BAHF, 9.06 g (0.015 mol) of the compound (a) obtained in Synthesis Example 1, 3.72 g (0.015 mol) of DDS, and 0.62 g (0.003 mol) of SiDA were dissolved in 100 g of NMP. 15.51 g (0.05 mol) of ODPA was added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a powder of a polyimide precursor resin (B).

17.5 g of the obtained resin (B), 2.3 g of the quinonediazide compound (e) obtained in Synthesis Example 5, 16 g of the novolac resin (i) obtained in Synthesis Example 9, 4.0 g of crosslinker NIKALAC MX-290, and 1.0 g of KBM403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Example 3

In a dry nitrogen gas stream, 5.49 g (0.015 mol) of BAHF, 5.67 g (0.04 mol) of the compound (b) obtained in Synthesis Example 2, 3.72 g (0.015 mol) of DDS, and 0.62 g (0.003 mol) of SiDA were dissolved in 100 g of NMP. 11.11 g (0.025 mol) of 6FDA and 7.76 g (0.025 mol) of ODPA were added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a polyimide precursor resin (C).

17.5 g of the obtained resin (C), 2.3 g of the quinonediazide compound (f) obtained in Synthesis Example 6, 16 g of the polyhydroxystyrene resin (j) obtained in Synthesis Example 10, 4.0 g of DMOM-PC, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Example 4

In a dry nitrogen gas stream, 5.49 g (0.015 mol) of BAHF, 3.65 g (0.015 mol) of the compound (c) obtained in Synthesis Example 3, 2.48 g (0.01 mol) of DDS, and 0.62 g (0.003 mol) of SiDA were dissolved in 100 g of NMP. 11.11 g (0.025 mol) of 6FDA and 7.76 g (0.025 mol) of ODPA were added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a powder of a polyimide precursor resin (D).

17.5 g of the obtained resin (D), 2.3 g of the quinonediazide compound (g) obtained in Synthesis Example 7, 16 g of the acrylic resin (h) obtained in Synthesis Example 8, 4.0 g of crosslinker DMOM-PTBP, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Example 5

In a dry nitrogen gas stream, 1.83 g (0.005 mol) of BAHF, 9.06 g (0.015 mol) of the compound (a) obtained in Synthesis Example 1, 4.96 g (0.02 mol) of DDS, and 0.62 g (0.003 mol) of SiDA were dissolved in 100 g of NMP. 15.51 g (0.05 mol) of ODPA was added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a polyimide precursor resin (E).

17.5 g of the obtained resin (E), 2.3 g of the quinonediazide compound (d) obtained in Synthesis Example 4, 16 g of the novolac resin (i) obtained in Synthesis Example 9, 4.0 g of crosslinker HMOM-TPHAP, and 1.0 g of KBM-403 were added to 50 g of GB, thereby giving a varnish of a positive-working photosensitive resin composition. Using the obtained varnish, the sensitivity, residual film rate, and heat resistance were evaluated as descried above. The evaluation results are shown in Table 2.

Example 6

In a dry nitrogen gas stream, 9.16 g (0.025 mol) of BAHF, 2.43 g (0.01 mol) of the compound (c) obtained in Synthesis Example 3, 1.24 g (0.005 mol) of DDS, and 0.62 g (0.003 mol) of SiDA were dissolved in 100 g of NMP. 11.11 g (0.025 mol) of 6FDA and 7.76 g (0.025 mol) of ODPA were added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a polyimide precursor resin (F).

17.5 g of the obtained resin (F), 2.3 g of the quinonediazide compound (e) obtained in Synthesis Example 5, 16 g of the polyhydroxystyrene resin (j) obtained in Synthesis Example 10, 4.0 g of crosslinker NIKALAC MX-270, and 1.0 g of KBM-403 were added to 50 g of GBL, thereby giving a varnish F of a positive-working photosensitive resin composition. Using the obtained varnish, the sensitivity, residual film rate, and heat resistance were evaluated as descried above. The evaluation results are shown in Table 2.

Example 7

17.5 g of the resin (E) obtained in Example 5, 2.3 g of the quinonediazide compound (f) obtained in Synthesis Example 6, 16 g of the novolac resin (i) obtained in Synthesis Example 9, 2.0 g of crosslinker NIKALAC MX-270, 2.0 g of crosslinker DMOM-PTBP, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Example 8

17.5 g of the resin (D) obtained in Example 4, 2.3 g of the quinonediazide compound (g) obtained in Synthesis Example 7, 16 g of the novolac resin (i) obtained in Synthesis Example 9, 2.0 g of crosslinker NIKALAC MX-290, 2.0 g of crosslinker HMOM-TPHAP, and 1.0 g of KBM-403 were added to 50 g of GBL, thereby giving a varnish of a positive-working photosensitive resin composition. Using the obtained varnish, the sensitivity, residual film rate, and heat resistance were evaluated as described above. The evaluation results are shown in Table 2.

Example 9

17.5 g of the resin (F) obtained in Example 6, 2.3 g of the quinonediazide compound (e) obtained in Synthesis Example 5, 16 g of the polyhydroxystyrene resin (j) obtained in Synthesis Example 10, 2.0 g of crosslinker NIKALAC MX-290, 2.0 g of crosslinker DMOM-PC, and 1.0 g of KBM-403 were added to 50 g of GBL, thereby giving a varnish of a positive-working photosensitive resin composition. Using the obtained varnish, the sensitivity, residual film rate, and heat resistance were evaluated as described above. The evaluation results are shown in Table 2.

Comparative Example 1

In a dry nitrogen gas stream, 14.65 g (0.04 mol) of BAHF and 0.62 g (0.003 mol) of SiDA were dissolved in 100 g of NMP. 15.51 g (0.05 mol) of ODPA was added thereto together with 10 g of NMP, allowed to react at 60° C. for 1 hour, and then stirred at 180° C. for 4 hours. After the completion of stirring, the solution was placed in 2 L of water, thereby giving a white precipitate. The precipitate was collected by filtration, washed three times with water, and then dried in a vacuum dryer at 50° C. for 72 hours, thereby giving a powder of a closed-ring polyimide resin (G).

17.5 g of the obtained resin (G), 2.3 g of the quinonediazide compound (d) obtained in Synthesis Example 4, 16 g of the acrylic resin (h) obtained in Synthesis Example 8, 4.0 g of crosslinker NIKALAC MX-290, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Comparative Example 2

In a dry nitrogen gas stream, 8.01 g (0.04 mol) of DAE and 0.62 g (0.003 mol) of SiDA were dissolved in 100 g of NMP. 15.51 g (0.05 mol) of ODPA was added thereto together 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a powder of a polyimide precursor resin (H).

17.5 g of the obtained resin (H), 2.3 g of the quinonediazide compound (d) obtained in Synthesis Example 4, 16 g of the novolac resin (i) obtained in Synthesis Example 9, 4.0 g of crosslinker DMOM-PC, and 1.0 g of KBM403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

Comparative Example 3

In a dry nitrogen gas stream, 2.43 g (0.01 mol) of the compound (c) obtained in Synthesis Example 3, 9.73 g (0.04 mol) of DDS, and 0.62 g (0.003 mol) of SiDA were dissolved in 100 g of NMP. 11.11 g (0.025 mol) of 6FDA and 7.76 g (0.025 mol) of ODPA were added thereto together with 10 g of NMP, and allowed to react at 40° C. for 1 hour. Subsequently, a solution of 13.10 g (0.11 mol) of N,N-dimethylformamide dimethyl acetal diluted with 15 g of NMP was added dropwise over 10 minutes. After the dropwise addition, the mixture was stirred at 40° C. for 1 hour. After the completion of the reaction, the solution was placed in 2 L of water, and the resulting solid precipitate was collected by filtration. The resin solid was dried in a vacuum dryer at 50° C. for 72 hours, thereby giving a polyimide precursor resin (I).

17.5 g of the obtained resin (I), 2.3 g of the quinonediazide compound (d) obtained in Synthesis Example 4, 16 g of the polyhydroxystyrene resin (j) obtained in Synthesis Example 10, 4.0 g of crosslinker NIKALAC MX-290, and 1.0 g of KBM-403 were added to 50 g of GBL, thereby giving a varnish F of a positive-working photosensitive resin composition. Using the obtained varnish, the sensitivity, residual film rate, and heat resistance were evaluated as descried above. The evaluation results are shown in Table 2.

Comparative Example 4

In a dry nitrogen gas stream, 8.42 g (0.023 mol) of BAHF, 9.73 g (0.023 mol) of ABPS, and 0.62 g (0.003 mol) of SiDA were dissolved in 100 g of NMP. 15.51 g (0.05 mol) of ODPA was added thereto together with 10 g of NMP, allowed to react at 60° C. for 1 hour, and then stirred at 180° C. for 4 hours. After the completion of stirring, the solution was placed in 2 L of water, thereby giving a white precipitate. The precipitate was collected by filtration, washed three times with water, and then dried in a vacuum dryer at 50° C. for 72 hours, thereby giving a powder of a closed-ring polyimide resin (J).

17.5 g of the obtained resin (J), 2.3 g of the quinonediazide compound (d) obtained in Synthesis Example 4, 16 g of the acrylic resin (h) obtained in Synthesis Example 8, 4.0 g of crosslinker DMOM-PTBP, and 1.0 g of KBM-403 were added to 50 g of GBL, thereby giving a varnish of a positive-working photosensitive resin composition. Using the obtained varnish, the sensitivity, residual film rate, and heat resistance were evaluated as descried above. The evaluation results are shown in Table 2.

The compounds having a phenolic hydroxyl group, photoacid generators, and thermal crosslinkers used in the examples and comparative examples are as follows.

[Chemical Formula 24]

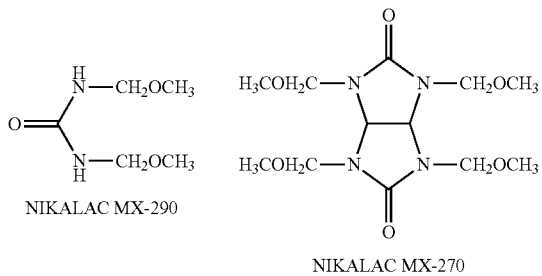

NIKALAC MX-290

NIKALAC MX-270

TABLE 1

| | Resin | Acid Component (molar ratio) | | Diamine Component (molar ratio) | | | | | | | Other | | |
|---|---|---|---|---|---|---|---|---|---|---|---|---|---|
| | Resin | 6FDA | ODPA | BAHF | (a) | (b) | (c) | ABPS | DAE | DDS | SiDA | Photosensitizer | Resin | Crosslinker |
| Example 1 | A | | 100 | 60 | | | | | | 20 | 5 | (d) | (h) | NIKALAC MX-270 |
| Example 2 | B | | 100 | 30 | 30 | | | | | 30 | 5 | (e) | (i) | NIKALAC MX-290 |
| Example 3 | C | 50 | 50 | 30 | | 30 | | | | 30 | 5 | (f) | (j) | DMOM-PC |
| Example 4 | D | 50 | 50 | 30 | | | 30 | | | 20 | 5 | (g) | (h) | DMOM-PTBP |
| Example 5 | E | | 100 | 10 | 30 | | | | | 40 | 5 | (d) | (i) | HMOM-TPHAP |
| Example 6 | F | 50 | 50 | 50 | | | 20 | | | 10 | 5 | (e) | (j) | NIKALAC MX-270 |
| Example 7 | E | | 100 | 10 | 30 | | | | | 40 | 5 | (f) | (i) | NIKALAC MX-270 DMOM-PTBP |
| Example 8 | D | 50 | 50 | 30 | | | 30 | | | 20 | 5 | (g) | (i) | NIKALAC MX-290 HMOM-TPHAP |
| Example 9 | F | 50 | 50 | 50 | | | 20 | | | 10 | 5 | (e) | (j) | NIKALAC MX-290 DMOM-PC |
| Comparative Example 1 | G | | 100 | 80 | | | | | | | 5 | (d) | (h) | NIKALAC MX-290 |
| Comparative Example 2 | H | | 100 | | | | | | 80 | | 5 | (d) | (i) | DMOM-PC |
| Comparative Example 3 | I | 50 | 50 | | | | | 80 | | | 5 | (d) | (j) | NIKALAC MX-290 |
| Comparative Example 4 | J | | 100 | 45 | | | | 45 | | | 5 | (d) | (h) | DMOM-PTBP |

TABLE 2

| | Resin | Sensitivity Eth (mJ/cm$^2$) | Residual Film Rate Evaluation | Heat Resistance Evaluation | |
|---|---|---|---|---|---|
| | | | | 5% heat weight loss | Tg |
| Example 1 | A | 350 | 85% | ○ | ○ |
| Example 2 | B | 250 | 93% | ○ | ○ |
| Example 3 | C | 270 | 90% | ○ | ○ |
| Example 4 | D | 280 | 91% | ○ | ○ |
| Example 5 | E | 240 | 90% | ○ | ○ |
| Example 6 | F | 280 | 88% | ○ | ○ |
| Example 7 | E | 220 | 89% | ○ | ⊙ |
| Example 8 | D | 260 | 88% | ○ | ⊙ |
| Example 9 | F | 260 | 86% | ○ | ⊙ |
| Comparative Example 1 | G | 450 | 79% | Δ | ○ |
| Comparative Example 2 | H | >1000 | 98% | ○ | ○ |
| Comparative Example 3 | I | 300 | 94% | X | X |
| Comparative Example 4 | J | 320 | 65% | Δ | ○ |

-continued

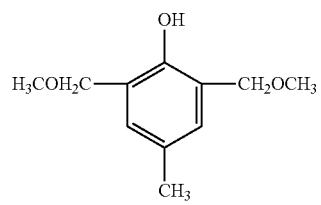

DMOM-PC

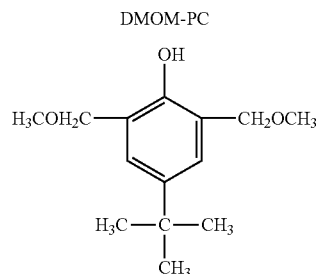

DMOM-PTBP

-continued

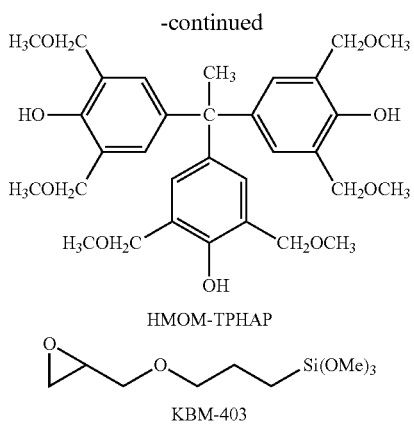

HMOM-TPHAP

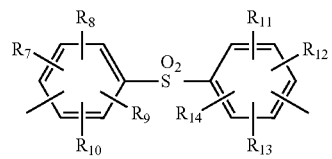

KBM-403

DESCRIPTION OF REFERENCE SIGNS

1: Silicon wafer
2: Al pad
3: Passivation film
4: Insulating film
5: Metal (Cr, Ti, etc.) film
6: Trace (Al, Cu, etc.)
7: Insulating film
8: Barrier metal
9: Scribe line
10: Solder bump

The invention claimed is:

1. A resin comprising a structure represented by the following general formula (1) or (2) as a main component

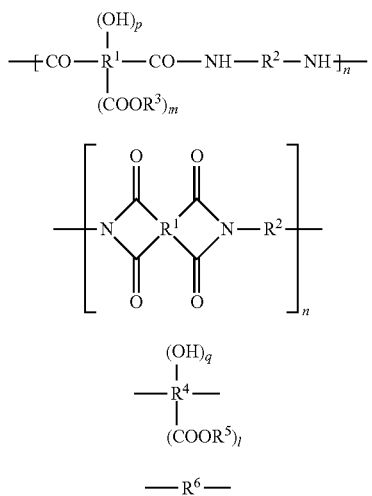

wherein
R$^1$ is a C$_{2-30}$ divalent to octavalent organic group,
R$^2$ represents two or more different organic groups represented by general formula (3) or an organic group represented by general formula (4),
R$^3$ and R$^5$ may be the same or different and represent a hydrogen atom or a C$_{1-20}$ organic group, R$^4$ represents a C$_{2-20}$ trivalent to octavalent organic group except for a structure having a sulfonyl group,
R$^6$ represents a C$_{2-30}$ divalent to octavalent organic group having no hydroxyl group and having a sulfonyl group and an aromatic ring,
n is within a range of 10 to 100,000,
m and l each represent an integer of 0 to 2,
p represents an integer of 0 to 4, and
q represents an integer of 1 to 4, with the proviso that p+q>1; and
wherein the molar ratio between the organic groups represented by general formula (3) of R$^2$ and the organic group represented by general formula (4) of R$^2$ is 9:1 to 5:5.

2. The resin according to claim 1, wherein the R$^6$ in general formula (4) is an organic group represented by the following general formula (5):

(5)

$$\begin{array}{c}R_8 \quad R_{11}\\ R_7 \diagup \diagdown \quad \diagup \diagdown R_{12}\\ \quad \text{—}\underset{\overset{\|}{O_2}}{S}\text{—}\\ \diagdown \diagup \quad \diagdown \diagup\\ R_{10} \quad R_9 \quad R_{14} \quad R_{13}\end{array}$$

wherein
R$^7$ to R$^{14}$ each independently represent a hydrogen atom, a sulfonic acid, a halogen atom, or a C$_{1-30}$ monovalent organic group, but do not contain an hydroxyl group.

3. A photosensitive resin composition comprising the resin according to claim 1 (a), a photosensitizer (b), a thermal crosslinker (c), and a solvent (d), wherein the composition has positive photosensitivity.

4. The photosensitive resin composition according to claim 3, wherein the thermal crosslinker (c) contains at least the following two compounds:
(1) a compound having an alkoxymethyl group and a phenolic hydroxyl group; and
(2) a compound having an alkoxymethyl group and a urea-based organic group.

5. A method for producing a patterned cured film, comprising:
a step of applying the photosensitive resin composition according to claim 3 onto a supporting substrate, followed by drying, so as to produce a first photosensitive resin film;
a step of exposing the first photosensitive resin film to obtain an exposed photosensitive resin film;
a step of developing the exposed photosensitive resin film using an aqueous alkali solution to obtain a patterned resin film; and
a step of heat-treating the patterned resin film to produce the patterned cured film.

6. A patterned cured film for an interlayer dielectric film or a surface protective film obtainable by the method for producing a patterned cured film according to claim 5.

7. An electronic component comprising the interlayer dielectric film according to claim 6.

* * * * *